(12) United States Patent
Jung et al.

(10) Patent No.: US 12,137,580 B2
(45) Date of Patent: Nov. 5, 2024

(54) FLEXIBLE DISPLAY DEVICE INCLUDING ANTI-REFLECTION LAYER AND ANTI-GLARE LAYER, AND ELECTRONIC APPARATUS INCLUDING SAME

(71) Applicant: Samsung Electronics Co., Ltd., Suwon-si (KR)

(72) Inventors: Songhee Jung, Suwon-si (KR); Jungbae Bae, Suwon-si (KR); Joongyu Lee, Suwon-si (KR); Hyunchang Shin, Suwon-si (KR); Byungduk Yang, Suwon-si (KR); Kwangtai Kim, Suwon-si (KR); Donghyun Yeom, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 519 days.

(21) Appl. No.: 17/277,582

(22) PCT Filed: Sep. 19, 2019

(86) PCT No.: PCT/KR2019/012145
§ 371 (c)(1),
(2) Date: Mar. 18, 2021

(87) PCT Pub. No.: WO2020/060228
PCT Pub. Date: Mar. 26, 2020

(65) Prior Publication Data
US 2021/0359277 A1  Nov. 18, 2021

(30) Foreign Application Priority Data

Sep. 21, 2018 (KR) ........................ 10-2018-0114193

(51) Int. Cl.
*H04M 1/02* (2006.01)
*H10K 50/84* (2023.01)
(Continued)

(52) U.S. Cl.
CPC .......... *H10K 50/86* (2023.02); *H04M 1/0269* (2022.02); *H10K 50/84* (2023.02);
(Continued)

(58) Field of Classification Search
CPC ...... H10K 50/86; H10K 50/841; H10K 50/84; H10K 50/8426; H10K 2102/311; H04M 1/0269
See application file for complete search history.

(56) References Cited

U.S. PATENT DOCUMENTS 8,582,049 B2  11/2013  Shim et al.
9,572,272 B2  2/2017  Lee
(Continued)

FOREIGN PATENT DOCUMENTS

CN  107037916 A  8/2017
CN  107230696 A  10/2017
(Continued)

OTHER PUBLICATIONS

European Search Report dated Oct. 12, 2021, issued in European Application No. 19862869.5.
(Continued)

*Primary Examiner* — Jacob R Crum
(74) *Attorney, Agent, or Firm* — Jefferson IP Law, LLP

(57) ABSTRACT

Disclosed is an electronic device. An electronic device according to an embodiment may comprise: a display panel of which at least a portion is flexible; a window disposed above at least the portion of the display panel; an anti-reflection layer (AR/LR) disposed above at least a portion of the window; and an anti-glare layer (AG) disposed below at least the portion of the window. Various other embodiments are also possible.

12 Claims, 42 Drawing Sheets

(51) Int. Cl.
*H10K 50/842* (2023.01)
*H10K 50/86* (2023.01)
*H10K 102/00* (2023.01)

(52) U.S. Cl.
CPC ....... *H10K 50/841* (2023.02); *H10K 50/8426* (2023.02); *H10K 2102/311* (2023.02)

(56) References Cited

U.S. PATENT DOCUMENTS

| | | | |
|---|---|---|---|
| 2014/0240856 A1* | 8/2014 | Allore | H04M 1/0266 264/1.24 |
| 2015/0363030 A1 | 12/2015 | Nam et al. | |
| 2016/0178821 A1 | 6/2016 | Choi et al. | |
| 2016/0295685 A1* | 10/2016 | Ryu | G06F 1/1652 |
| 2016/0364055 A1 | 12/2016 | Huh et al. | |
| 2016/0378231 A1 | 12/2016 | Kim et al. | |
| 2017/0309867 A1* | 10/2017 | Mun | H10K 50/86 |
| 2017/0343852 A1* | 11/2017 | Park | H10K 59/40 |
| 2018/0011515 A1 | 1/2018 | Yoo et al. | |
| 2018/0123083 A1 | 5/2018 | Im et al. | |
| 2018/0149785 A1 | 5/2018 | Lee et al. | |
| 2018/0192527 A1* | 7/2018 | Yun | G09F 9/301 |

FOREIGN PATENT DOCUMENTS

| | | |
|---|---|---|
| CN | 107884929 A | 4/2018 |
| CN | 108122488 A | 6/2018 |
| JP | 2016-170413 A | 9/2016 |
| KR | 10-2014-0033546 A | 3/2014 |
| KR | 10-2017-0032172 A | 3/2017 |
| KR | 10-2018-0005476 A | 1/2018 |
| KR | 10-2018-0008204 A | 1/2018 |
| KR | 10-2018-0046424 A | 5/2018 |
| KR | 10-2018-0061484 A | 6/2018 |
| WO | 2018/008865 A1 | 1/2018 |

OTHER PUBLICATIONS

European Office Action dated Feb. 23, 2023, issued in European Application No. 19862869.5.
Korean Office Action dated Mar. 13, 2023, issued in Korean Application No. 10-2018-0114193.
Chinese Office Action dated Apr. 11, 2023, issued in Chinese Application No. 201980061837.8.
Chinese Office Action dated Sep. 1, 2022, issued in Chinese Application No. 201980061837.8.
Chinese Notice of Allowance dated Jul. 21, 2023, issued in Chinese Application No. 201980061837.8.
Korean Office Action dated Sep. 26, 2023, issued in Korean Application No. 10-2018-0114193.
Korean Office Action dated May 17, 2024, issued in Korean Application No. 10-2018-0114193.

* cited by examiner

FLEXIBLE DISPLAY DEVICE INCLUDING ANTI-REFLECTION LAYER AND ANTI-GLARE LAYER, AND ELECTRONIC APPARATUS INCLUDING SAME

CROSS-REFERENCE TO RELATED APPLICATION(S)

This application is a U.S. National Stage application under 35 U.S.C. § 371 of an International application number PCT/KR2019/012145, filed on Sep. 19, 2019, which is based on and claims priority of a Korean patent application number 10-2018-0114193, filed on Sep. 21, 2018, in the Korean Intellectual Property Office, the disclosure of which is incorporated by reference herein in its entirety.

TECHNICAL FIELD

Various embodiments relate to a flexible display device including an anti-reflection layer and an anti-glare layer, and an electronic device including the same.

BACKGROUND ART

Electronic devices such as mobile devices are the trend of being increasingly miniaturized, but even demand for large screen display devices is increasing. In response to the demand for the large screen display devices, the mobile devices can miniaturize a bezel of a surface where the display device is disposed.

Even though the bezel is miniaturized, screen expansion is difficult because of a limitation of a size of the electronic device, so the electronic device can have a foldable display device. The foldable display device can be folded and unfolded according to need, and a user can select and use the foldable display device as a large screen or a small screen.

DISCLOSURE OF INVENTION

Technical Problem

A foldable region of a foldable display device can suffer a compressive force and a tensile force by a use of an electronic device and thus, can suffer strain resulting from stress. The strain of the foldable region can generate a step portion, and this step portion can change a path of reflected light and therefore, the strain of the foldable region can be acknowledged externally. An electronic device of various embodiments can offer a way of preventing the step portion generated by the strain from being acknowledged externally, and reducing an internal stress which is the cause of forming the step portion.

Solution to Problem

An electronic device of an embodiment can include a display panel of which at least a portion is flexible, a window disposed above at least the portion of the display panel, an anti-reflection layer (AR/LR) disposed on at least a portion of the window, and an anti-glare layer (AG) disposed beneath at least the portion of the window.

A display device of an embodiment can include a display panel of which at least a portion is flexible, a window disposed above at least the portion of the display panel, an anti-glare layer (AG) disposed on at least the portion of the window, and an anti-reflection layer (AR/LR) disposed on the anti-glare layer.

Advantageous Effects of Invention

An electronic device of an embodiment can prevent the deformation of a window provided in a foldable region of a flexible display device from being acknowledged externally.

An electronic device of various embodiments can miniaturize the deformation of a flexible display device by decreasing an internal stress of a deformed portion.

BEST MODE FOR CARRYING OUT THE INVENTION

Figure 1:
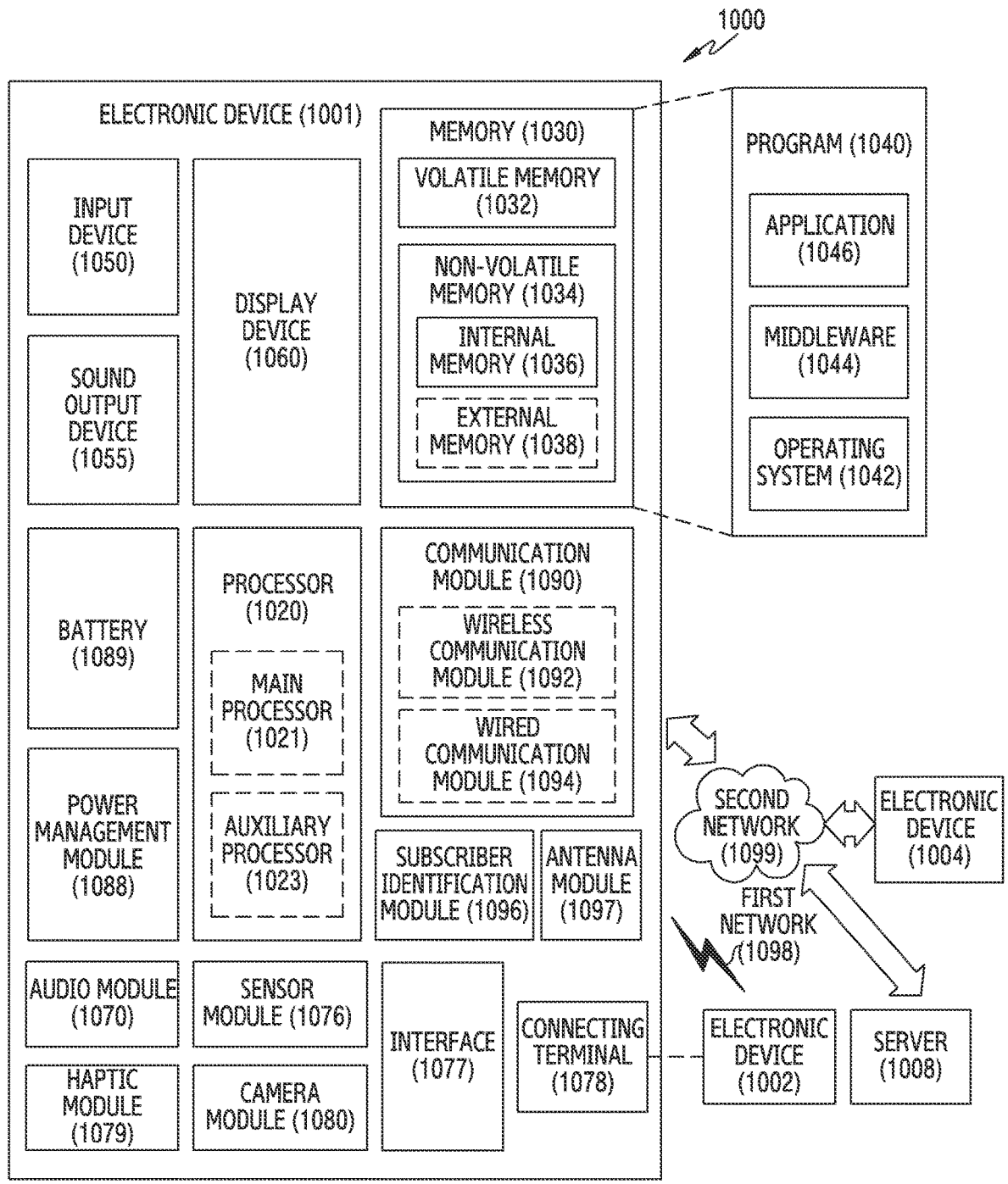
FIG. 1 is a block diagram of an electronic device within a network environment according to various embodiments.

FIG. 1 is a block diagram illustrating an electronic device 1001 in a network environment 1000 according to various embodiments. Referring to FIG. 1, the electronic device 1001 in the network environment 1000 may communicate with an electronic device 1002 via a first network 1098 (e.g., a short-range wireless communication network), or an electronic device 1004 or a server 1008 via a second network 1099 (e.g., a long-range wireless communication network). According to an embodiment, the electronic device 1001 may communicate with the electronic device 1004 via the server 1008. According to an embodiment, the electronic device 1001 may include a processor 1020, memory 1030, an input device 1050, a sound output device 1055, a display device 1060, an audio module 1070, a sensor module 1076, an interface 1077, a haptic module 1079, a camera module 1080, a power management module 1088, a battery 1089, a communication module 1090, a subscriber identification module (SIM) 1096, or an antenna module 1097. In some embodiments, at least one (e.g., the display device 1060 or the camera module 1080) of the components may be omitted from the electronic device 1001, or one or more other components may be added in the electronic device 1001. In some embodiments, some of the components may be implemented as single integrated circuitry. For example, the sensor module 1076 (e.g., a fingerprint sensor, an iris sensor, or an illuminance sensor) may be implemented as embedded in the display device 1060 (e.g., a display).

The processor 1020 may execute, for example, software (e.g., a program 1040) to control at least one other component (e.g., a hardware or software component) of the electronic device 1001 coupled with the processor 1020, and may perform various data processing or computation. According to one embodiment, as at least part of the data processing or computation, the processor 1020 may load a command or data received from another component (e.g., the sensor module 1076 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an application processor (AP)), and an auxiliary processor 1023 (e.g., a graphics processing unit (GPU), an image signal processor (ISP), a sensor hub processor, or a communication processor (CP)) that is operable independently from, or in conjunction with, the main processor 1021. Additionally or alternatively, the auxiliary processor 1023 may be adapted to consume less power than the main processor 1021, or to be specific to a specified function. The auxiliary processor 1023 may be implemented as separate from, or as part of the main processor 1021.

The auxiliary processor 1023 may control at least some of functions or states related to at least one component (e.g., the display device 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to an embodiment, the auxiliary processor 1023 (e.g., an image signal processor or a communication processor) may be implemented as part of another component (e.g., the camera module 1080 or the communication module 1090) functionally related to the auxiliary processor 1023.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input device 1050 may receive a command or data to be used by other component (e.g., the processor 1020) of the electronic device 1001, from the outside (e.g., a user) of the electronic device 1001. The input device 1050 may include, for example, a microphone, a mouse, a keyboard, or a digital pen (e.g., a stylus pen).

The sound output device 1055 may output sound signals to the outside of the electronic device 1001. The sound output device 1055 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1060 may visually provide information to the outside (e.g., a user) of the electronic device 1001. The display device 1060 may include, for example, a display, a hologram device, or a projector and control circuitry to control a corresponding one of the display, hologram device, and projector. According to an embodiment, the display device 1060 may include touch circuitry adapted to detect a touch, or sensor circuitry (e.g., a pressure sensor) adapted to measure the intensity of force incurred by the touch.

The audio module 1070 may convert a sound into an electrical signal and vice versa. According to an embodiment, the audio module 1070 may obtain the sound via the input device 1050, or output the sound via the sound output device 1055 or a headphone of an external electronic device (e.g., an electronic device 1002) directly (e.g., wiredly) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. According to an embodiment, the sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device (e.g., the electronic device 1002) directly (e.g., wiredly) or wirelessly. According to an embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device (e.g., the electronic device 1002). According to an embodiment, the connecting terminal 1078 may include, for example, a HDMI connector, a USB connector, a SD card connector, or an audio connector (e.g., a headphone connector).

The haptic module 1079 may convert an electrical signal into a mechanical stimulus (e.g., a vibration or a movement) or electrical stimulus which may be recognized by a user via his tactile sensation or kinesthetic sensation. According to an embodiment, the haptic module 1079 may include, for example, a motor, a piezoelectric element, or an electric stimulator.

The camera module 1080 may capture a still image or moving images. According to an embodiment, the camera module 1080 may include one or more lenses, image sensors, image signal processors, or flashes.

The power management module 1088 may manage power supplied to the electronic device 1001. According to one embodiment, the power management module 1088 may be implemented as at least part of, for example, a power management integrated circuit (PMIC).

The battery 1089 may supply power to at least one component of the electronic device 1001. According to an embodiment, the battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more communication processors that are operable independently from the processor 1020 (e.g., the application processor (AP)) and supports a direct (e.g., wired) communication or a wireless communication. According to an embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or infrared data association (IrDA)) or the second network 1099 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The antenna module 1097 may transmit or receive a signal or power to or from the outside (e.g., the external electronic device) of the electronic device 1001. According to an embodiment, the antenna module 1097 may include an antenna including a radiating element composed of a conductive material or a conductive pattern formed in or on a substrate (e.g., PCB). According to an embodiment, the antenna module 1097 may include a plurality of antennas. In such a case, at least one antenna appropriate for a communication scheme used in the communication network, such as the first network 1098 or the second network 1099, may be selected, for example, by the communication module 1090 (e.g., the wireless communication module 1092) from the plurality of antennas. The signal or the power may then be transmitted or received between the communication module 1090 and the external electronic device via the selected at least one antenna. According to an embodiment, another component (e.g., a radio frequency integrated circuit (RFIC)) other than the radiating element may be additionally formed as part of the antenna module 1097.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1001 and the external electronic device 1004 via the server 1008 coupled with the second network 1099. Each of the electronic devices 1002 and 1004 may be a device of a same type as, or a different type, from the electronic device 1001. According to an embodiment, all or some of operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, or client-server computing technology may be used, for example.

Figure 2:
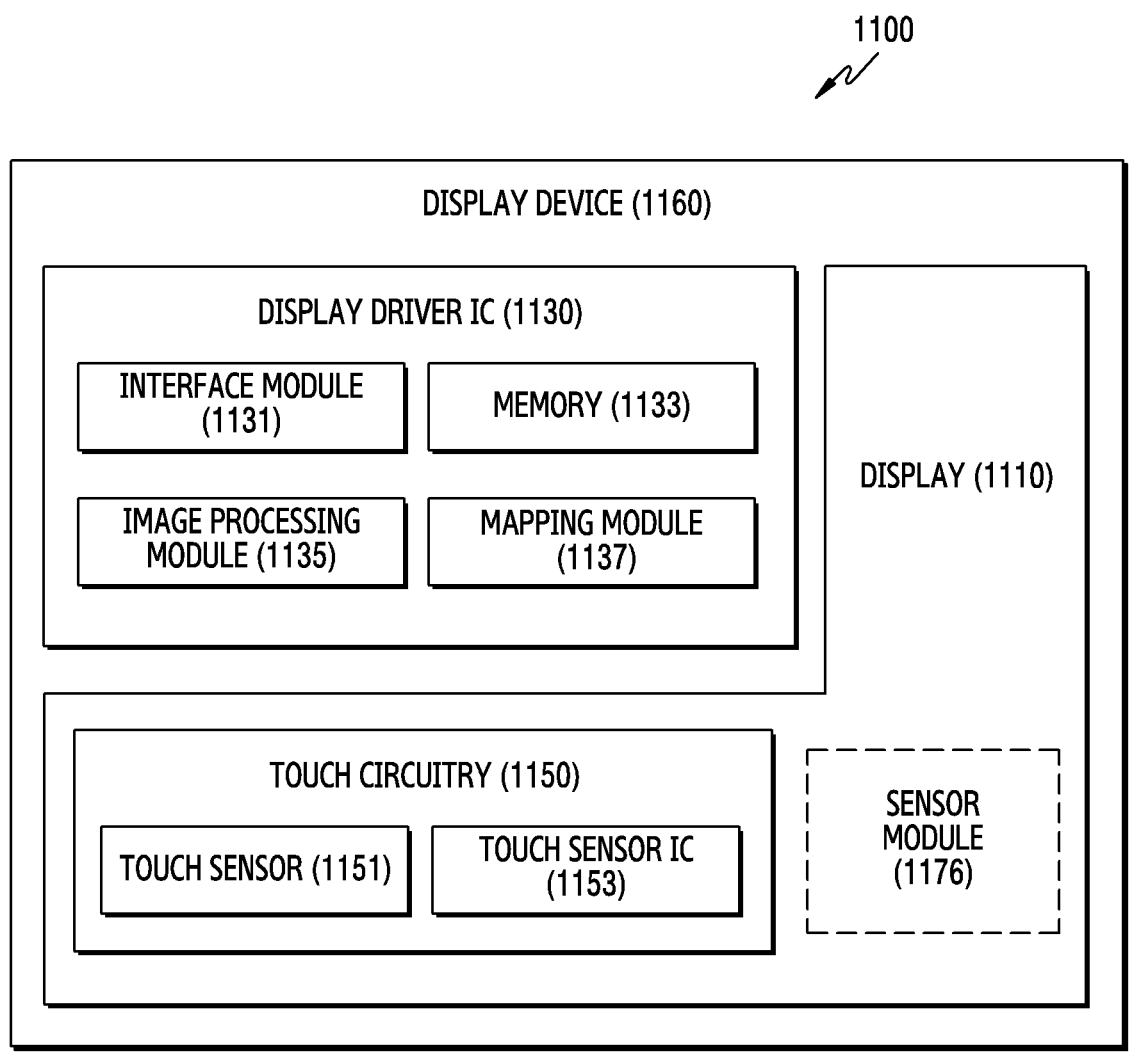
FIG. 2 is a block diagram of a display device according to various embodiments.

FIG. 2 is a block diagram 1100 of a display device 1160 according to various embodiments. Referring to FIG. 2, the display device 1160 can include a display 1110, and a display driver IC (DDI) 1130 to control the same. The DDI 1130 can include an interface module 1131, a memory 1133 (e.g., a buffer memory), an image processing module 1135, or a mapping module 1137. The DDI 1130 can receive image information that includes image data or an image control signal corresponding to a command to control the image data, from another component of the electronic device 1001 via the interface module 1131. For example, according to an embodiment, the image information can be received from the processor 1020 (e.g., the main processor 1021 (e.g., an application processor)) or the auxiliary processor 1023 (e.g., a graphics processing unit) operated independently from the function of the main processor 1021. The DDI 1130 can communicate with a touch circuitry 1150 or a sensor module 1176, etc. via the interface module 1131. Also, the DDI 1130 can store at least part of the received image information in the memory 1133, for example, on a frame by frame basis. The image processing module 1135 can, for example, perform pre-processing or post-processing (e.g., resolution, brightness, or size adjustment) for at least part of the image data, based at least on a characteristic of the image data or a characteristic of the display 1110. The mapping module 1137 can provide a voltage value or current value corresponding to the image data which has been pre-processed or post-processed by the image processing module 1035. According to an embodiment, the provision of the voltage value or current value, for example, can be performed based at least in part on an attribute of pixels of the display 1110 (e.g., an array (RGB stripe or Pentile structure) of the pixels, or a size of each of sub pixels). At least some pixels of the display 1110, for example, can be driven based at least in part on the voltage value or the current value wherein visual information (e.g., a text, an image, or an icon) corresponding to the image data can be displayed via the display 1110.

According to an embodiment, the display device 1160 can further include the touch circuitry 1150. The touch circuitry 1150 can include a touch sensor 1151, and a touch sensor IC 1153 to control the same. The touch sensor IC 1153, for example can control the touch sensor 1151 to obtain a touch input or a hovering input with respect to a specific position on the display 1110. For example, by measuring a change in a signal (e.g., a voltage, a quantity of light, a resistance, or a quantity of electric charges) with respect to a specific position on the display 1110, the touch sensor IC 1153 can obtain a touch input or a hovering input. The touch sensor IC 1153 can offer information (e.g., a position, an area, a pressure, or a time) on the obtained touch input or hovering input, to the processor 1020. According to an embodiment, at least a portion (e.g., the touch sensor IC 1153) of the touch circuitry 1150 can be included as a portion of the display driver IC 1130 or the display 1110 or as a portion of another component (e.g., the auxiliary processor 1023) disposed outside the display device 1160.

According to an embodiment, the display device 1160 can further include at least one sensor (e.g., a fingerprint sensor, an iris sensor, a pressure sensor, or an illuminance sensor) of the sensor module 1176, or a control circuit for the same. In such a case, the at least one sensor or the control circuit for the same can be embedded in a portion (e.g., the display 1110 or the DDI 1130) of the display device 1160 or a portion of the touch circuitry 1150. For example, when the sensor module 1176 embedded in the display device 1160 includes a biometric sensor (e.g., a fingerprint sensor), the biometric sensor can acquire biometric information (e.g., a fingerprint image) associated with a touch input via a partial region of the display 1110. For another example, when the sensor module 1176 embedded in the display device 1160 includes a pressure sensor, the pressure sensor can acquire pressure information associated with a touch input via a partial or whole area of the display 1110. According to an embodiment, the touch sensor 1151 or the sensor module 1176 can be disposed between pixels in a pixel layer of the display 1110, or over or under the pixel layer.

Figure 3A:
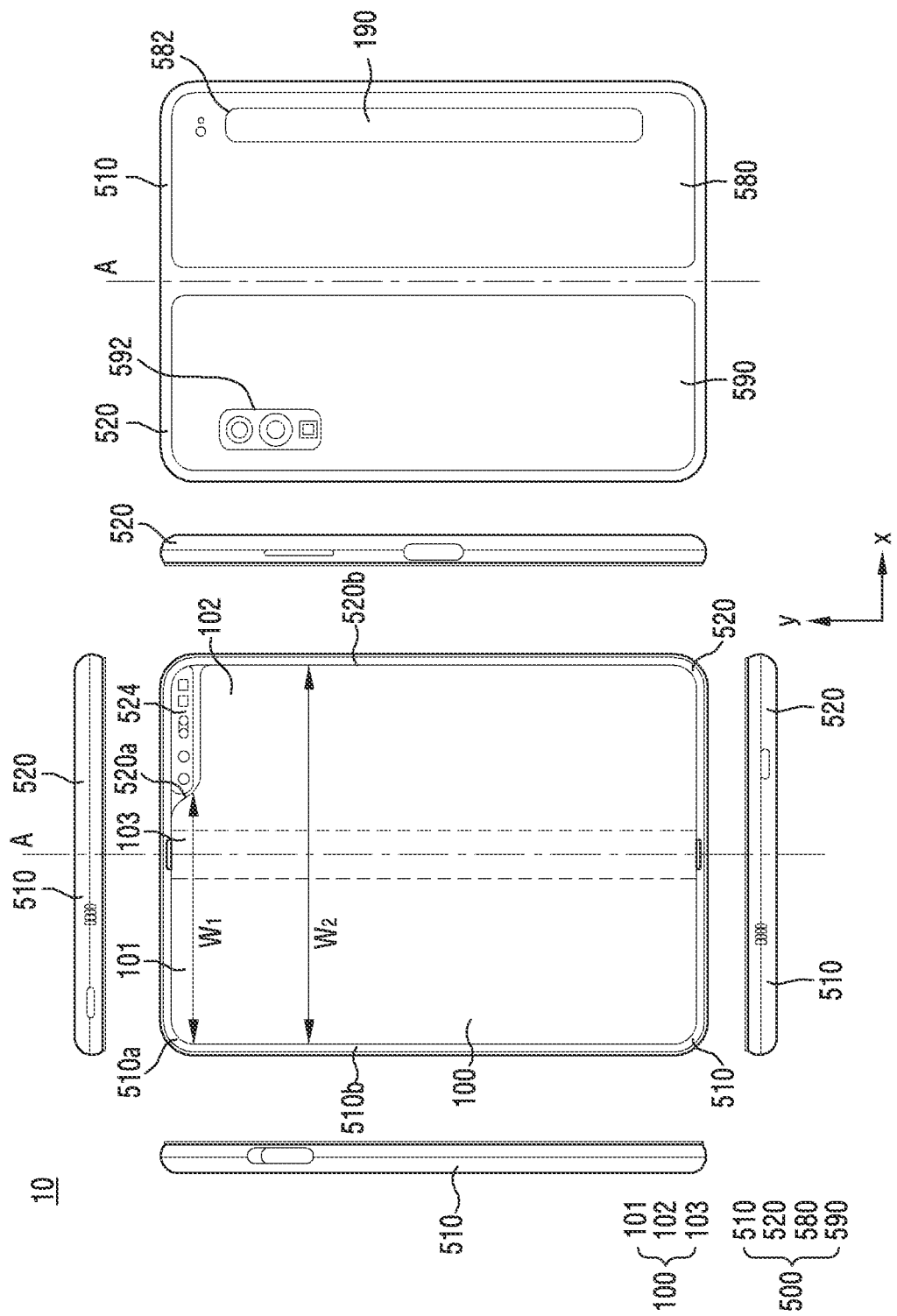
FIG. 3A is a diagram illustrating a flat state of an electronic device according to an embodiment.
Figure 3B:
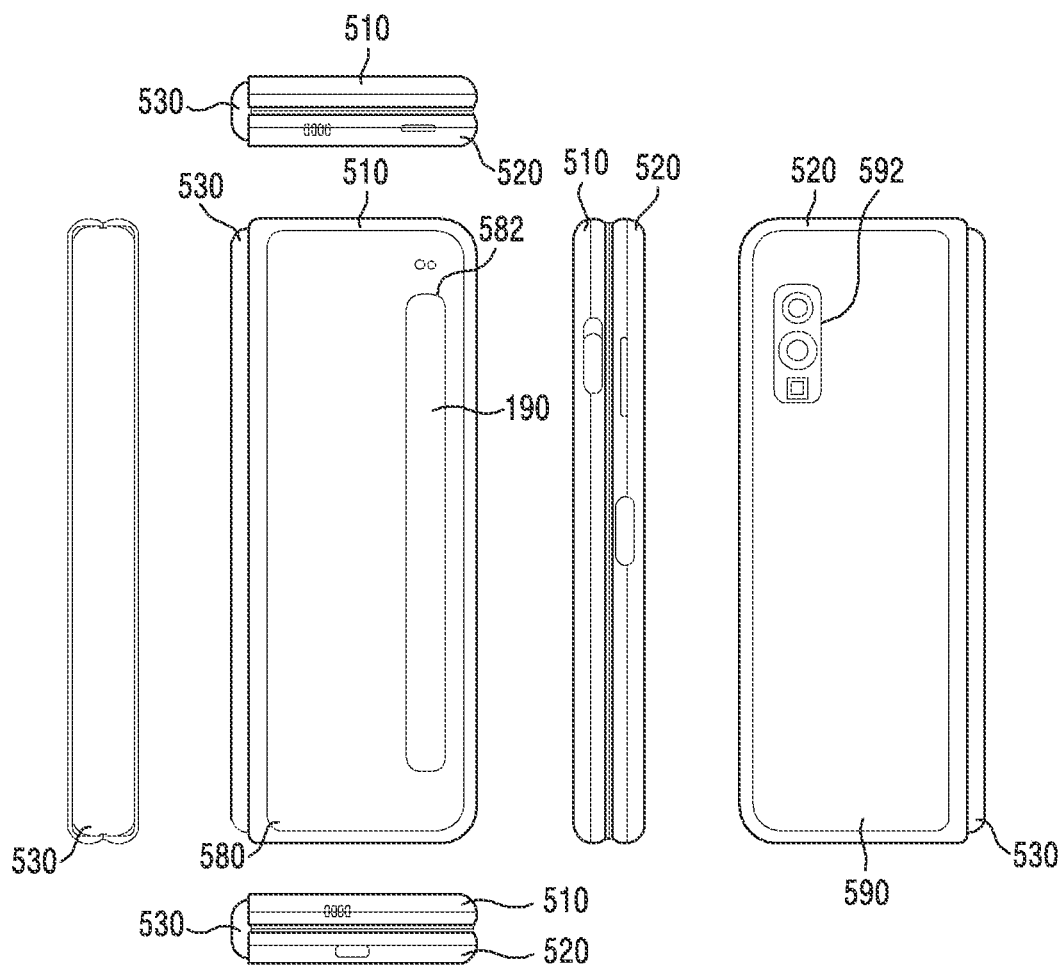
FIG. 3B is a diagram illustrating a folded state of an electronic device according to an embodiment.

FIG. 3A is a diagram illustrating a flat state of an electronic device according to an embodiment, and FIG. 3B is a diagram illustrating a folded state of the electronic device according to an embodiment.

The electronic device 10 of FIG. 3A and FIG. 3B can be the same as or similar with the electronic device 1001 of FIG. 1.

Referring to FIG. 3A and FIG. 3B, in an embodiment, the electronic device 10 can include a foldable housing 500, a hinge cover 530 covering a foldable portion of the foldable housing 500, and a flexible or foldable display 100 (below, abbreviated to a "display" 100) disposed within a space offered by the foldable housing 500. The present document defines a surface where the display 100 is disposed, as a first surface, or a front surface of the electronic device 10. And, a surface opposite to the front surface is defined as a second surface, or a rear surface of the electronic device 10. Also, a surface surrounding a space between the front surface and the rear surface is defined as a third surface, or a lateral surface of the electronic device 10.

In an embodiment, the foldable housing 500 can include a first housing structure 510, a second housing structure 520 including a sensor region 524, a first back cover 580, and a second back cover 590. The foldable housing 500 of the electronic device 10 is not limited to the form and coupling illustrated FIG. 3A and FIG. 2, and can be implemented by a combination and/or coupling of other shapes or components. For example, in another embodiment, the first housing structure 510 and the first back cover 580 can be integrally formed, and the second housing structure 520 and the second back cover 590 can be integrally formed.

In an embodiment illustrated, the first housing structure 510 and the second housing structure 520 can be disposed at both sides centering on a folding axis (axis A), and have a shape symmetric entirely with respect to the folding axis A. As described later, the first housing structure 510 and the second housing structure 520 can be different in mutually formed angle or distance according to whether a state of the electronic device 10 is a flat state, a folded state, or an intermediate state. In an embodiment illustrated, the second housing structure 520, unlike the first housing structure 510, additionally includes the sensor region 524 where various sensors are disposed, but can have a mutually symmetric shape in other regions.

In an embodiment, as illustrated in FIG. 3A, the first housing structure 510 and the second housing structure 520 can offer a recess which accepts the display 100, together. In an embodiment illustrated, because of the sensor region 524, the recess can have mutually different two or more widths in a direction being vertical with respect to the folding axis A.

For example, the recess can have (1) a first width (w1) between a first portion 510a parallel with the folding axis A among the first housing structure 510 and a first portion 520a formed in a periphery of the sensor region 524 among the second housing structure 520, and (2) a second width (w2) formed between a second portion 510b of the first housing structure 510 and a second portion 520b which does not correspond to the sensor region 524 among the second housing structure 520 and is parallel with the folding axis A. In this case, the second width (w2) can be formed longer than the first width (w1). In other words, the first portion 510a of the first housing structure 510 and the first portion 520a of the second housing structure 520 having a mutually asymmetric shape can form the first width (w1) of the recess, and the second portion 510b of the first housing structure 510 and the second portion 520b of the second housing structure 520 having a mutually symmetric shape can form the second width (w2) of the recess. In an embodiment, the first portion 520a, and the second portion 520b, of the second housing structure 520 can be mutually different in distance from the folding axis A. The width of the recess is not limited to the illustrated example. In various embodiments, the recess can have a plurality of widths, by the form of the sensor region 524 or asymmetric shape portions of the first housing structure 510 and the second housing structure 520.

In an embodiment, at least a portion of the first housing structure 510 and the second housing structure 520 can be formed of metal materials or non-metal materials having a rigidity of a selected strength so as to support the display 100.

In an embodiment, the sensor region 524 can be formed to have a certain region in adjacent to a corner of the second housing structure 520. However, an arrangement, shape, and size of the sensor region 524 are not limited to the illustrated example. For example, in another embodiment, the sensor region 524 can be offered to another corner of the second housing structure 520 or an arbitrary region between an upper corner and a lower corner. In an embodiment, components for performing various functions embedded in the electronic device 10 can be exposed to a front surface of the electronic device 10 via the sensor region 524, or via one or more openings prepared in the sensor region 524. In various embodiments, the components can include various kinds of sensors. The sensor, for example, can include at least one of a front camera, a receiver, or a proximity sensor.

The first back cover 580 can be disposed at one side of the folding axis (A) in the rear surface of the electronic device 10, and can, for example, have a periphery which is a substantially rectangular shape, and the periphery can be surrounded by the first housing structure 510. Similarly, the second back cover 590 can be disposed at the other side of the folding axis (A) in the rear surface of the electronic device 10, and its periphery can be surrounded by the second housing structure 520.

In an embodiment illustrated, the first back cover 580 and the second back cover 590 can have a shape which is substantially symmetric centering on the folding axis (axis A). However, the first back cover 580 and the second back cover 590 do not necessarily have a mutually symmetric shape, and in another embodiment, the electronic device 10 can include the first back cover 580 and the second back cover 590 of various shapes. In further embodiment, the first back cover 580 can be formed integrally with the first housing structure 510, and the second back cover 590 can be formed integrally with the second housing structure 520.

In an embodiment, the first back cover 580, the second back cover 590, the first housing structure 510, and the second housing structure 520 can offer a space where various components (e.g., a printed circuit board or a battery) of the electronic device 10 can be disposed. In an embodiment, one or more components can be disposed in the rear surface of the electronic device 10 or be visually exposed. For example, at least a portion of a sub display 190 can be visually exposed via a first back region 582 of the first back cover 580. In another embodiment, one or more components or sensors can be visually exposed via a second back region 592 of the second back cover 590. In various embodiments, the sensor can include a proximity sensor and/or a rear camera.

Referring to FIG. 3B, the hinge cover 530 can be disposed between the first housing structure 510 and the second housing structure 520, and be constructed to cover an internal component (for example, a hinge structure). In an embodiment, the hinge cover 530 can be covered with a portion of the first housing structure 510 and the second housing structure 520 or be exposed to the external, according to a state (a flat state or a folded state) of the electronic device 10.

In one example, as illustrated in FIG. 3A, in response to the electronic device 10 being in a flat state, the hinge cover 530 can be covered with the first housing structure 510 and the second housing structure 520 and not be exposed. In one example, as illustrated in FIG. 3B, in response to the electronic device 10 being in a folded state (e.g., a fully folded state), the hinge cover 530 can be exposed to the external between the first housing structure 510 and the second housing structure 520. In one example, when the first housing structure 510 and the second housing structure 520 are in an intermediate state of being folded at a certain angle, the hinge cover 530 can be partially exposed to the external between the first housing structure 510 and the second housing structure 520. However, in this case, the exposed region can be less than in the fully folded state. In an embodiment, the hinge cover 530 can include a curved surface.

The display 100 can be disposed on a space offered by the foldable housing 500. For example, the display 100 can be safely mounted on a recess formed by the foldable housing 500, and construct most of the front surface of the electronic device 10.

Accordingly, the front surface of the electronic device 10 can include the display 100, a partial region of the first housing structure 510 adjacent to the display 100, and a partial region of the second housing structure 520. And, the rear surface of the electronic device 10 can include the first back cover 580, a partial region of the first housing structure 510 adjacent to the first back cover 580, the second back cover 590, and a partial region of the second housing structure 520 adjacent to the second back cover 590.

The display 100 can refer to a display of which at least a partial region can be deformed into a flat surface or a curved surface. In an embodiment, the display 100 can include a folding region 103, a first region 101 disposed at one side (the left side of the folding region 103 illustrated in FIG. 3A) with a criterion of the folding region 103, and a second region 102 disposed at the other side (the right side of the folding region 103 illustrated in FIG. 3A).

The division of the region of the display 100 illustrated in FIG. 3A is an example, and the display 100 can be divided into a plurality of (for example, four or more or two) regions according to a structure or function. In an example, in an embodiment illustrated in FIG. 3A, the region of the display 100 can be divided by the folding region 103 or folding axis (axis A) extending in parallel with a y axis, but in another embodiment, the region of the display 100 can be divided with a criterion of another folding region (e.g., a folding region being parallel with an x axis) or another folding axis (e.g., a folding axis being parallel with the x axis) as well.

The first region 101 and the second region 102 can have a shape which is entirely symmetric centering on the folding region 103. However, the second region 102 can, unlike the first region 101, include a notch which is cut according to the existence of the sensor region 524, but can have a shape being symmetric with that of the first region 101 in other regions. In other words, the first region 101 and the second region 102 can include a portion having a mutually symmetric shape, and a portion having a mutually asymmetric shape.

Below, a description is made for operations of the first housing structure 510 and the second housing structure 520 dependent on a state (e.g., a flat state and a folded state) of the electronic device 10, and each region of the display 100.

In an embodiment, in response to the electronic device 10 being in the flat state (e.g., FIG. 3A), the first housing structure 510 and the second housing structure 520 can be disposed to form an angle of 180 degrees and go in the same direction. A surface of the first region 110 of the display 100 and a surface of the second region 102 can form 180 degrees mutually, and go in the same direction (e.g., a front direction of the electronic device). The folding region 103 can form the same plane as the first region 101 and the second region 102.

In an embodiment, in response to the electronic device 10 being in the folded state (e.g., FIG. 3B), the first housing structure 510 and the second housing structure 520 can be disposed to face each other. The surface of the first region 101 of the display 100 and the surface of the second region 102 can form a mutually narrow angle (e.g., 0 degree to 10 degrees), and face each other. The folding region 103 can be formed by a curved surface of which at least a portion has a certain curvature.

In an embodiment, in response to the electronic device 10 being in the intermediate state (not shown), the first housing structure 510 and the second housing structure 520 can be disposed at a certain angle. The surface of the first region 101 of the display 100 and the surface of the second region 102 can form an angle which is greater than in the folded state and is less than in the flat state. The folding region 103 can be formed by a curved surface of which at least a portion has a certain curvature, and at this time, the curvature can be less than that of the folded state.

Figure 3C:
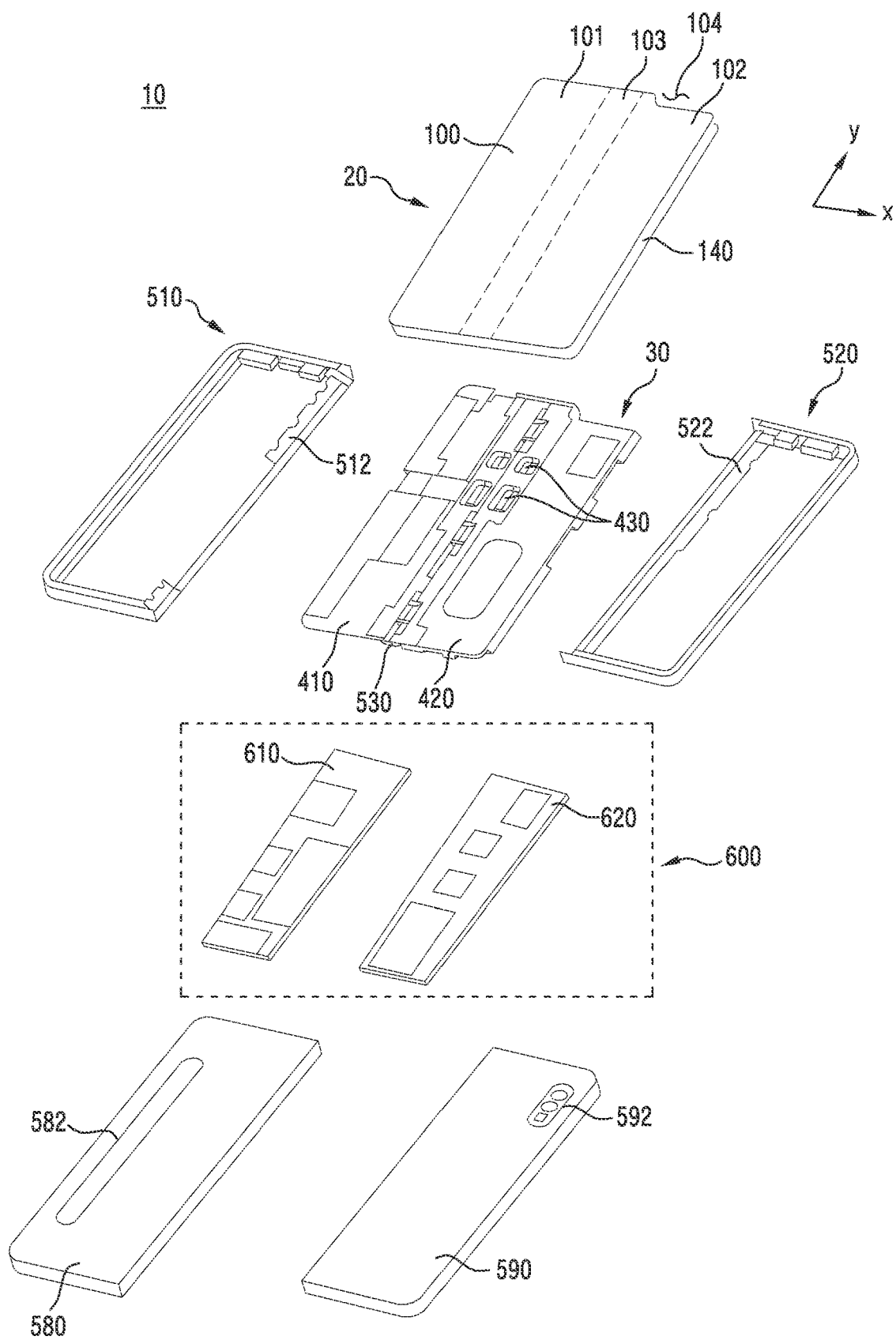
FIG. 3C is an exploded perspective diagram of an electronic device according to an embodiment.

FIG. 3C is an exploded perspective diagram of an electronic device according to an embodiment.

Referring to FIG. 3C, in an embodiment, the electronic device 10 can include a display unit 20, a bracket assembly 30, a substrate unit 600, the first housing structure 510, the second housing structure 520, the first back cover 580, and the second back cover 590. In the present document, the display unit 20 can be called a display module or a display assembly.

The display unit 20 can include the display 100, and one or more plates or layers 140 in which the display 100 is safely mounted. In an embodiment, the plate 140 can be disposed between the display 100 and the bracket assembly 30. The display 100 can be disposed in at least a portion of one surface (e.g., a top surface with a criterion of FIG. 3C) of the plate 140. The plate 140 can be formed in a shape corresponding to the display 100. For example, a partial region of the plate 140 can be formed in a shape corresponding to a notch 104 of the display 100.

The bracket assembly 30 can include a first bracket 410, a second bracket 420, a hinge structure disposed between the first bracket 410 and the second bracket 420, a hinge cover 530 covering the hinge structure when viewing outside, and a wiring member 430 (e.g., a flexible printed circuit (FPC)) going across the first bracket 410 and the second bracket 420.

In an embodiment, the bracket assembly 30 can be disposed between the plate 140 and the substrate unit 600. In an example, the first bracket 410 can be disposed between the first region 101 of the display 100 and a first substrate 610. The second bracket 420 can be disposed between the second region 102 of the display 100 and a second substrate 620.

In an embodiment, the wiring member 430 and at least a portion of the hinge structure can be disposed within the bracket assembly 30. The wiring member 430 can be disposed in a direction (e.g., an x-axis direction) of going across the first bracket 410 and the second bracket 420. The wiring member 430 can be disposed in a direction (e.g., an x-axis direction) vertical to a folding axis (e.g., the y axis or the folding axis (A) of FIG. 3A) of the folding region 103 of the electronic device 10.

The substrate unit 600 can, as mentioned above, include the first substrate 610 disposed at a first bracket 410 side, and the second substrate 620 disposed at a second bracket 420 side. The first substrate 610 and the second substrate 620 can be disposed within a space which is offered by the bracket assembly 30, the first housing structure 510, the second housing structure 520, the first back cover 580, and the second back cover 590. Components for implementing various functions of the electronic device 10 can be mounted in the first substrate 610 and the second substrate 620.

The first housing structure 510 and the second housing structure 520 can be mutually assembled to be coupled to both sides of the bracket assembly 30, in a state in which the display unit 20 is coupled to the bracket assembly 30. As described later, the first housing structure 510 and the second housing structure 520 can be slid at both sides of the bracket assembly 30 and be coupled to the bracket assembly 30.

In an embodiment, the first housing structure 510 can include a first rotation support surface 512, and the second housing structure 520 can include a second rotation support surface 522 corresponding to the first rotation support surface 512. The first rotation support surface 512 and the second rotation support surface 522 can include a curved surface corresponding to the curved surface included in the hinge cover 530.

In an embodiment, in response to the electronic device 10 being in the flat state (e.g., the electronic device of FIG. 3A), the first rotation support surface 512 and the second rotation support surface 522 can cover the hinge cover 530 and thus, the hinge cover 530 is not exposed, or can be exposed minimally, to the rear surface of the electronic device 10. On the other hand, in response to the electronic device 10 being in the folded state (e.g., the electronic device of FIG. 3B), the first rotation support surface 512 and the second rotation support surface 522 can rotate along the curved surface included in the hinge cover 530 and thus, the hinge cover 530 can be exposed maximally to the rear surface of the electronic device 10.

The electronic device of various embodiments disclosed in the present document can be various types of devices. The electronic device, for example, can include a portable communication device (e.g., a smart phone), a computer device, a portable multimedia device, a portable medical device, a camera, a wearable device, or a home appliance. The electronic device of an embodiment of the present document is not limited to the aforementioned devices.

The electronic device of various embodiments disclosed in the present document can be various types of devices. The electronic device, for example, can include a portable communication device (e.g., a smart phone), a computer device, a portable multimedia device, a portable medical device, a camera, a wearable device, or a home appliance. The electronic device of an embodiment of the present document is not limited to the aforementioned devices.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1040) including one or more instructions that are stored in a storage medium (e.g., internal memory 1036 or external memory 1038) that is readable by a machine (e.g., the electronic device 1001). For example, a processor (e.g., the processor 1020) of the machine (e.g., the electronic device 1001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 4:
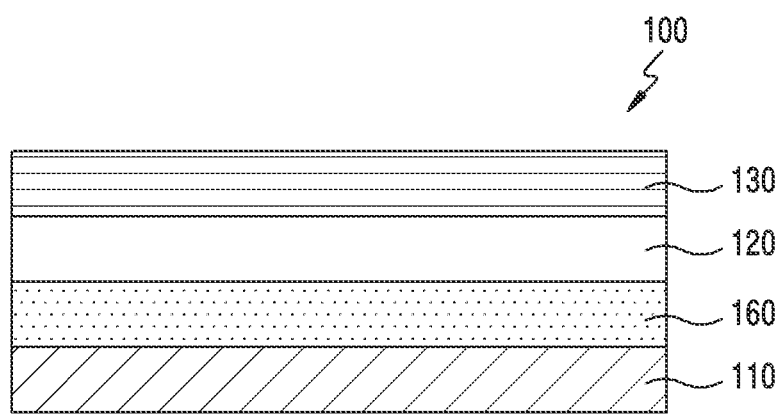
FIG. 4 is a cross section of a display according to an embodiment.

FIG. 4 is a cross section of a display according to an embodiment.

Referring to FIG. 4, the display 100 can include a display panel 110, a window 120, an anti-reflection layer 130, and an anti-glare layer 160.

According to an embodiment, the display panel 110 can be a display panel of which at least a portion is flexible. The display panel 110 can be an active light-emitting device such as an organic light-emitting display device. According to various embodiments, the display panel 110 can include a foldable panel, and can be formed to be foldable in a partial region of the display panel 110. According to an embodiment, the display panel 110 can include a base substrate, a thin film transistors (TFT) layer formed in the base substrate, and a pixel layer (or an organic light-emitting layer) receiving a signal voltage from the thin film transistors layer. The display panel 110 can further include arbitrary proper components such as a thin film encapsulation (TFE) layer encapsulating the pixel layer, a back film for supporting the base substrate, etc. The base substrate of an embodiment can be formed of polymer materials (e.g., polyimide (PI), etc.) to secure the flexibility of the substrate, but an embodiment is not limited to this.

According to an embodiment, the substrate can include at least one of polyehyleneterephthalate, polymethylmethacrylate, polyamide, polyimide, polypropylene or polyurethane.

According to an embodiment, the substrate can be formed by a plurality of layers.

According to an embodiment, the window 120 can be formed above the display panel 110, and the window 120 can be a flexible window. The window 120 can transmit light emitted from the pixel layer of the display panel 110 and forward the same to the external.

According to an embodiment, the window 120 can be formed of transparent member, and the transparent member can be formed of at least one of polymer materials such as polycarbonate (PC) of high molecular substance, polymethyl methacrylate (PMMA), polyimide (PI), polyethylene terephthalate (PET), polypropylene terephthalate (PPT), etc., and can be formed of flexible glass. According to an embodiment, the window 120 can include a multilayered structure of various materials.

According to an embodiment, the anti-reflection layer (AR layer) 130 can be disposed on the window 120. The anti-reflection layer 130 can destructively interfere reflected light to prevent incident light from being reflected and forwarded to a user, and can decrease the reflected light by the light incident from the external.

According to an embodiment, the anti-glare layer (AG layer) 160 can be disposed beneath the window 120. The anti-glare layer 160 can diffused-reflect light traveling from the external. The anti-glare layer 160 can form a ruggedness surface inside or add minute particles, to scatter external light in the rugged surface or a minute particle surface. The ruggedness surface can be included in another layer forming the display 100, not the anti-glare layer 160, as well.

FIG. 5A, FIG. 5B, FIG. 5C, and FIG. 5D are cross sections illustrating a laminated structure of a display according to various embodiments.

Figure 5A:
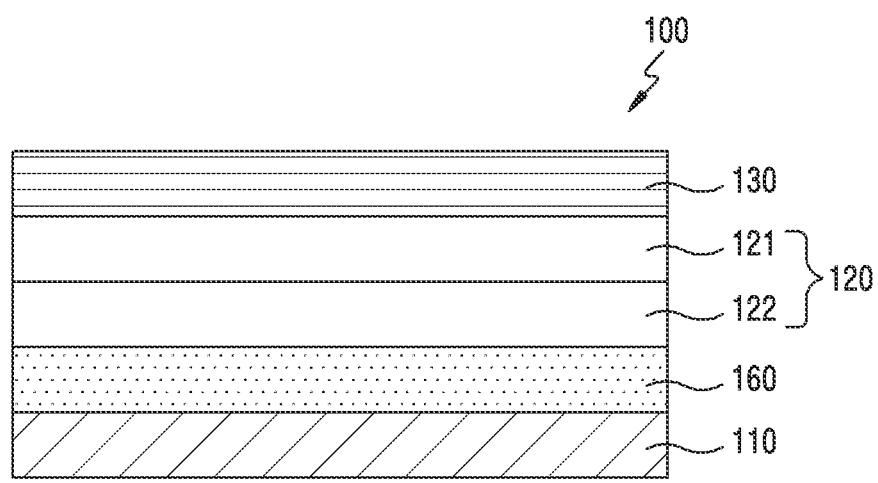
FIG. 5A, FIG. 5B, FIG. 5C, and FIG. 5D are cross sections illustrating a laminated structure of a display according to various embodiments.

Referring to FIG. 5A, the display 100 can be the same as or be similar with the display 100 of FIG. 4.

According to an embodiment, the display 100 can include a display panel 110, a window 120, an anti-reflection layer 130, and an anti-glare layer 160. The window 120 can have ductility to be pliable. According to various embodiments, the window 120 can be formed by a plurality of layers. The window 120 can include a first window 121 and a second window 122 of mutually different materials. The second window 122 can be disposed above the display panel 110, and the first window 121 can be disposed on the second window 122.

According to various embodiments, because the first window 121 is disposed more outside than the second window 122, in an in-foldable display, the first window 121 can suffer greater compressive stress than the second window 122, and compressive strain can be large. In an out-foldable display, the first window 121 can suffer greater tensile stress than the second window 122, and tensile strain can be large. The first window 121 can have a higher elongation than the second window 122, and can have lower Young's modulus.

According to various embodiments, the first window 121 can include polyimide (PI). The second window 122 can include polyethylene terephthalate (PET). The first window 121 and the second window 122 can be formed transparent. The first window 121 including polyimide disposed outside can have higher strain than the second window 122 including polyethylene terephthalate.

Figure 5B:
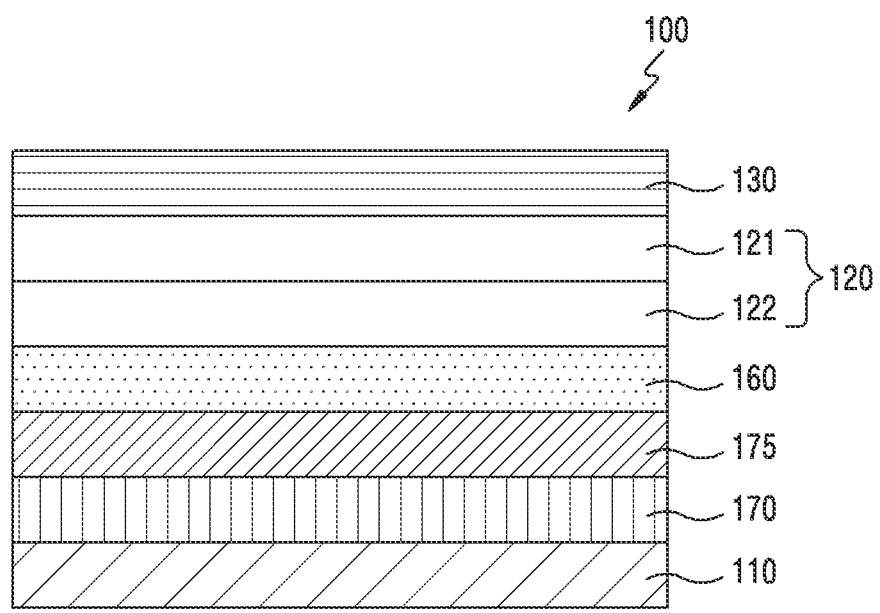
Figure 5C:
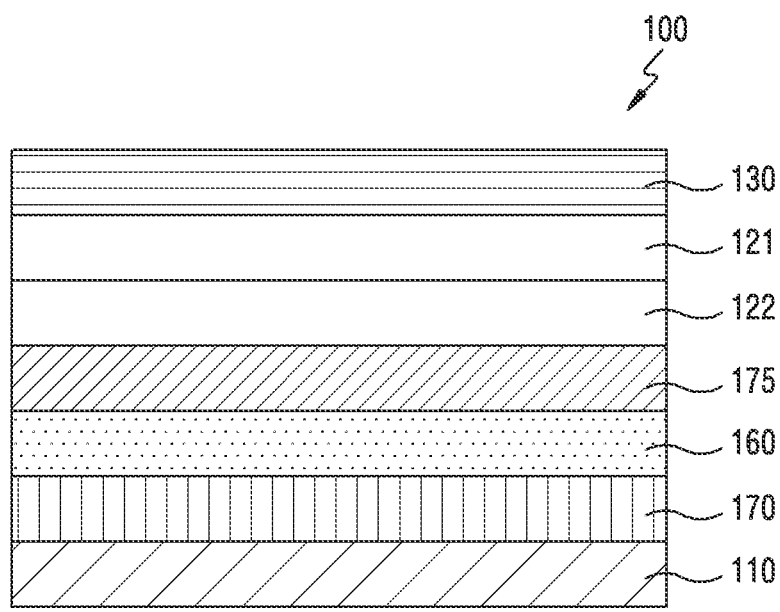
Figure 5D:
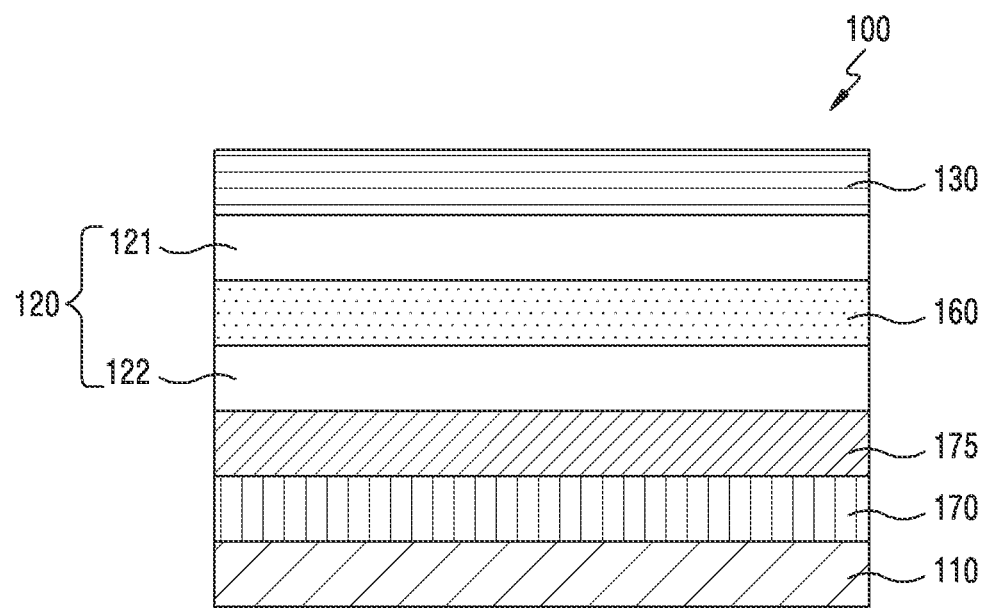

Referring to FIG. 5B, FIG. 5C, and FIG. 5D, the display 100 can include a display panel 110, a window 120, an anti-reflection layer 130, and an anti-glare layer 160, and can further include a polarization layer 170 and an optical clear adhesive (OCA) layer 175.

According to an embodiment, the polarization layer 170 can be disposed on the display panel 110, and the optical clear adhesive layer 175 can be disposed on the polarization layer 170. The polarization layer 170 can grant a directivity of light emitted from the display panel 110, and can increase a definition of an image or video forwarded. The optical clear adhesive layer 175 can be joined to the polarization layer 170, the window 120 or other layers.

According to an embodiment, the anti-glare layer 160 can be disposed between the second window 122 and the optical clear adhesive layer 175. According to various embodiments, the anti-glare layer 160 can be disposed between the optical clear adhesive layer 175 and the polarization layer 170. According to various embodiments, the anti-glare layer 160 can be disposed between the first window 121 and the second window 122.

According to an embodiment, the anti-reflection layer 130 can be disposed on the outskirts of the display 100, and the anti-glare layer 160 can be disposed between layers which are laminated between the anti-reflection layer 130 and the display panel 110. By a destructive interference of light reflected from the surface of the anti-reflection layer 130 and an interface between the anti-reflection layer 130 and the window 120, most light can be prevented from being reflected externally. According to various embodiments, partial light having passed through the anti-reflection layer 130 among light incident from the external can be diffused-reflected or scattered by the anti-glare layer 160. When external light is incident on the anti-glare layer 160 earlier than the anti-reflection layer 130, most light is scattered by the anti-glare layer 160 and thus, an anti-reflection effect of the anti-reflection layer 130 can be decreased.

Figure 6:
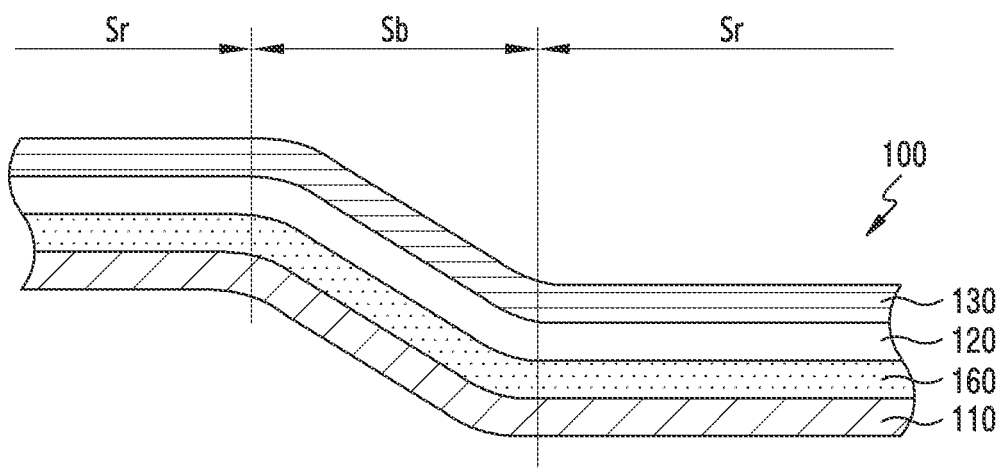
FIG. 6 is a schematic diagram illustrating the deformation of a display dependent on the use of an electronic device according to an embodiment.

FIG. 6 is a schematic diagram illustrating the deformation of a display dependent on the use of an electronic device according to an embodiment.

Referring to FIG. 6, the display 100 including a display panel 110, a window 120, an anti-reflection layer 130 and an anti-glare layer 160 can include a flexible region (Sb) and the remnant region (Sr).

According to an embodiment, the display 100 can be a flexible display, and can be bent in the flexible region (Sb). The display 100 can be bent in the flexible region (Sb), and in the flexible region (Sb), stress can be accumulated. Stress applied to the flexible region (Sb) can cause strain in each interlayer of the display 100, and a step portion can be formed minutely in the flexible region (Sb) of the display 100. The step portion formed in the flexible region (Sb) can be acknowledged as fine lines from the external.

According to an embodiment, to prevent the step portion from being acknowledged externally, the anti-reflection layer 130 can be laminated on the window 120, and the anti-glare layer 160 can be disposed below the anti-reflection layer 130

Figure 7A:
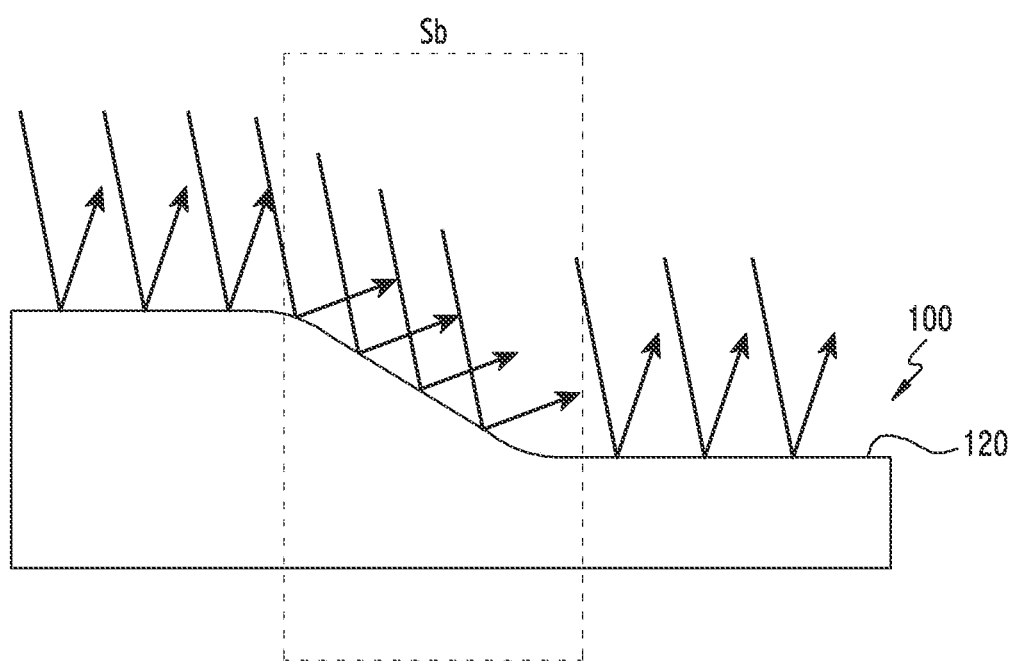
FIG. 7A is a schematic diagram illustrating a reflection of light incident on a display surface according to an embodiment.

FIG. 7A is a schematic diagram illustrating a reflection of light incident on a surface of a display according to an embodiment.

Referring to FIG. 7A, the display 100 can include a window 120 deformed in a flexible region (Sb). While the display 100 goes through a folding or unfolding process, each layer including the window 120 can suffer deformation, and a step portion can be formed in the flexible region (Sb).

Figure 7B:
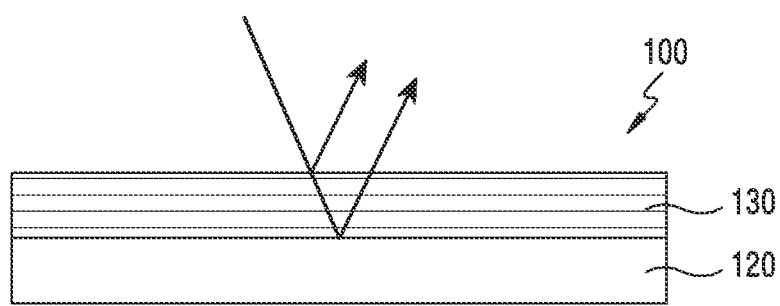
FIG. 7B is a diagram illustrating the principle of an anti-reflection layer according to an embodiment.
Figure 7C:
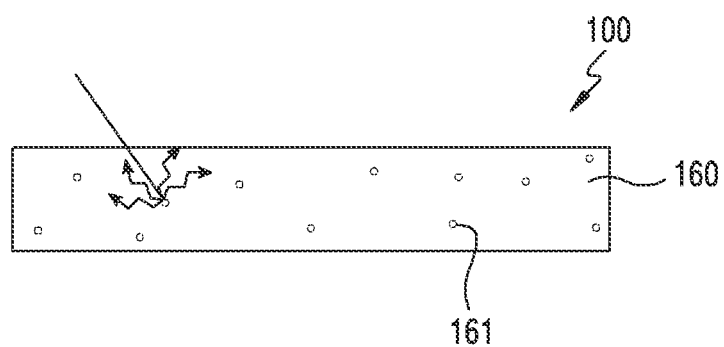
FIG. 7C and FIG. 7D are diagrams illustrating the principle of an anti-glare layer according to an embodiment.
Figure 7D:
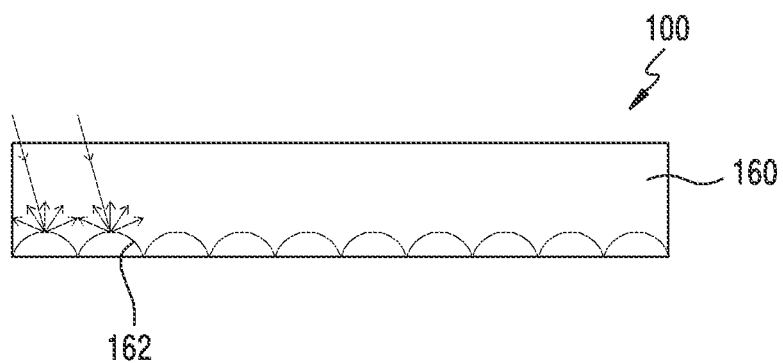

FIG. 7B is a diagram illustrating the principle of an anti-reflection layer according to an embodiment, and FIG. 7C and FIG. 7D are diagrams illustrating the principle of an anti-glare layer according to an embodiment.

Referring to FIG. 7B, a window 120 can be coated with the anti-reflection layer 130. Light incident on the anti-reflection layer 130 can be reflected from a surface of the anti-reflection layer 130, and some can pass through the anti-reflection layer 130 and be reflected from an interface between the anti-reflection layer 130 and the window 120. The light reflected from the surface of the anti-reflection layer 130 and the light reflected from the interface between the anti-reflection layer 130 and the window 120 can induce mutual interference mutually. In response to adjusting a thickness of the anti-reflection layer 130, the light reflected from the surface of the anti-reflection layer 130 and the light reflected from the interface between the anti-reflection layer 130 and the window 120 can induce destructive interference mutually.

According to an embodiment, in response to the thickness of the anti-reflection layer 130 corresponding to ¼ of a wavelength ($\lambda$) of light traveling in the anti-reflection layer 130, there may not be reflected light. According to various embodiments, the thickness of the anti-reflection layer 130 can be $(2m+1)\lambda/4$ ('n' is a natural number). According to various embodiments, in response to incident light not being single light, the anti-reflection layer 130 cannot offset wavelengths of all light and thus, can be formed by a plurality of layers to decrease a reflectance of a wavelength of light of a visible light range.

According to various embodiments, by suppressing the reflection of incident light, the anti-reflection layer 130 can decrease the external acknowledgement of a deformed portion formed in the flexible region (Sb) of the display 100.

Referring to FIG. 7C, the anti-glare layer 160 can include minute particles 161 inside. Light traveling to the minute particles 161 existing inside can be scattered. Referring to FIG. 7D, the anti-glare layer 160 can form a ruggedness surface 162 inside, and even light traveling to the ruggedness surface 162 can be scattered. A surface of the ruggedness surface 162 can be formed coarsely wherein diffused reflection takes place. The ruggedness surface 162 can be disposed irregularly, and can be disposed regularly at specific intervals as well.

According to various embodiments, the anti-glare layer 160 can scatter incident light, to decrease the external acknowledgement of the deformed portion formed in the flexible region (Sb) of the display 100.

Figure 8A:
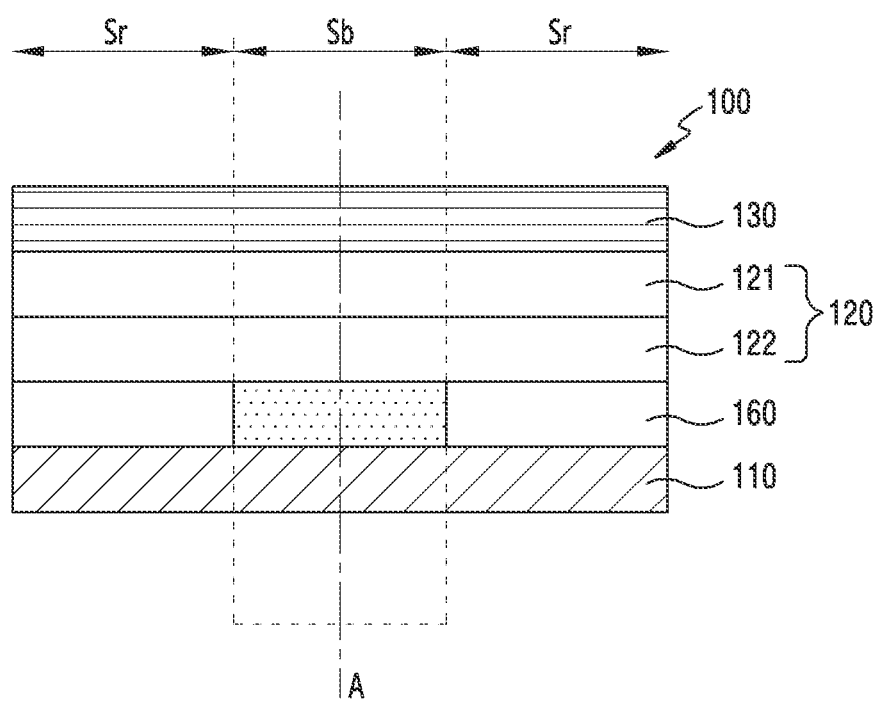
FIG. 8A and FIG. 8B are cross sections of a display according to an embodiment.
Figure 8B:
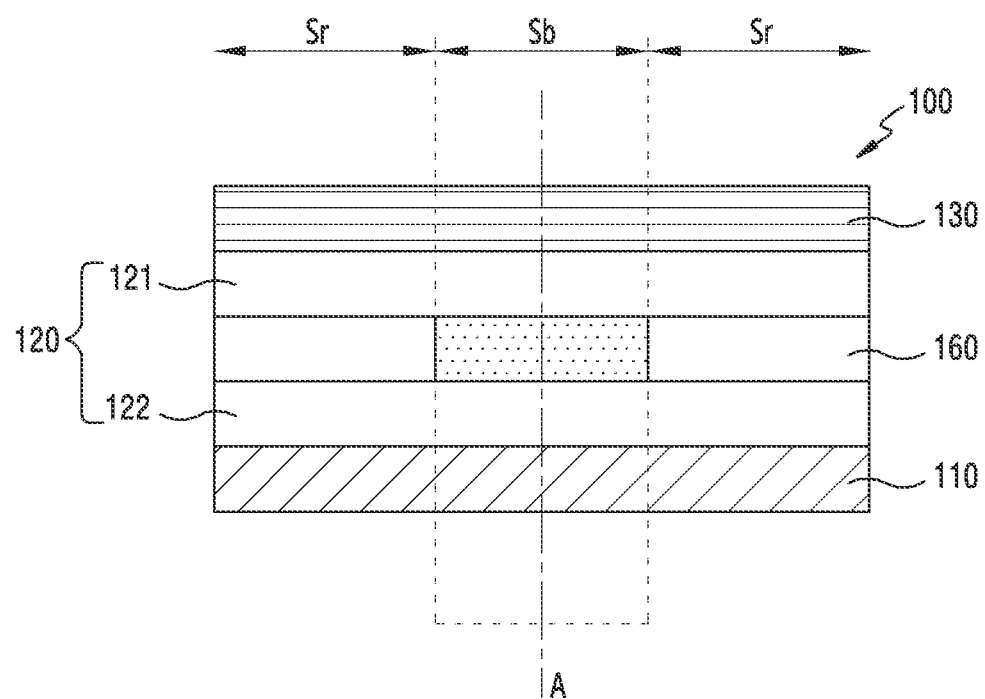

FIG. 8A and FIG. 8B are cross sections of a display according to an embodiment.

Referring to FIG. 8A, the display 100 can include a display panel 110, a window 120, an anti-reflection layer 130, and an anti-glare layer 160. The window 120 can have ductility to be pliable. According to various embodiments, the window 120 can be formed by a plurality of layers. The window 120 can include a first window 121 and a second window 122 of mutually different materials. The second window 122 can be disposed above the display panel 110, and the first window 121 can be disposed on the second window 122.

According to an embodiment, the display 100 can include a flexible region (Sb) and the remnant region (Sr). When taking the anti-reflection layer 130 upwardly, the flexible region (Sb) can be folded up or down with a criterion of a folding axis (A).

According to various embodiments, because the first window 121 is disposed more outside than the second window 122, in an in-foldable display, the first window 121 can suffer greater compressive stress than the second window 122, and compressive strain can be large. In an out-foldable display, the first window 121 can suffer greater tensile stress than the second window 122, and tensile strain can be large. The first window 121 can have a higher elongation than the second window 122, and can have lower Young's modulus.

According to various embodiments, the first window 121 can include polyimide (PI). The second window 122 can include polyethylene terephthalate (PET). The first window 121 and the second window 122 can be formed transparent.

According to various embodiments, the anti-reflection layer 130 can be disposed on the window 120, and the anti-glare layer 160 can be disposed between the window 120 and the display panel 110. The anti-reflection layer 130 can be disposed to surround the entire of the window 120.

According to various embodiments, the anti-glare layer 160 can be disposed wherein a region including a minute particle or a ruggedness surface is overlapped with the flexible region (Sb), and the anti-glare layer 160 can be disposed to include the minute particle or ruggedness surface only in the flexible region (Sb), and may not include the minute particle or ruggedness surface in the remnant region (Sr). The remnant region (Sr) of the anti-glare layer 160 can be formed integrally with the window 120, or be formed by an adhesive layer, etc.

According to various embodiments, when a step is formed with a criterion of the folding line (A) included in the flexible region (Sb), the anti-glare layer 160 can scatter light to decrease an amount of reflected light and thus, prevent a step portion formed in the display panel 110 from being acknowledged externally.

Referring to FIG. 8B, the display 100 can include a display panel 110, a window 120, an anti-reflection layer 130, and an anti-glare layer 160. The window 120 can have ductility to be pliable. Unlike FIG. 8A, the anti-glare layer 160 can be disposed between a first window 121 and a second window 122.

According to various embodiments, the anti-reflection layer 130 can be disposed on the window 120, and the anti-glare layer 160 can be disposed between the window 120 (i.e., the first window 121) and the display panel 110. The anti-reflection layer 130 can be disposed to surround the entire of the window 120.

According to various embodiments, the anti-glare layer 160 can be disposed wherein a region including a minute particle or a ruggedness surface is overlapped with the flexible region (Sb), and the anti-glare layer 160 can be disposed to include the minute particle or ruggedness surface only in the flexible region (Sb), and may not include the minute particle or ruggedness surface in the remnant region (Sr). The remnant region (Sr) of the anti-glare layer 160 can be formed integrally with the window 120, or be formed by an adhesive layer, etc.

According to various embodiments, when a step is formed with a criterion of the folding line (A) included in the flexible region (Sb), the anti-glare layer 160 can scatter light to decrease an amount of reflected light and thus, prevent a step portion formed in the display panel 110 and the second window 122 from being acknowledged externally.

Figure 9A:
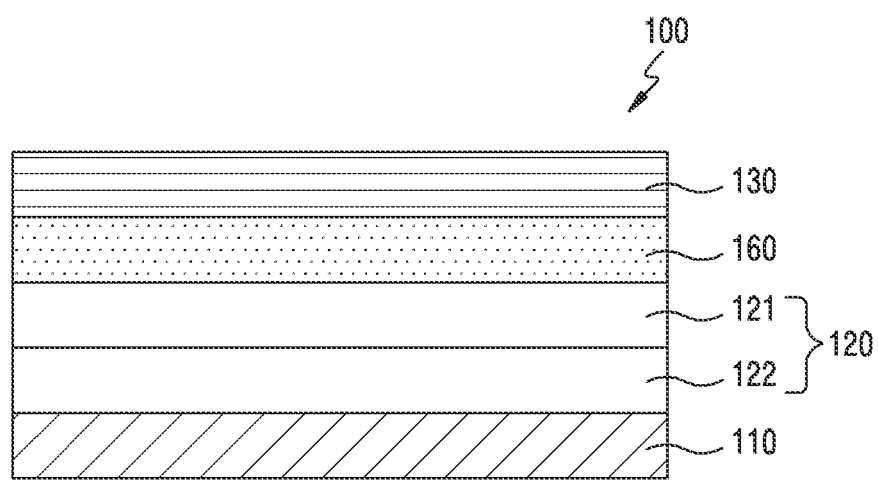
FIG. 9A and FIG. 9B are cross sections of a display according to various embodiments.
Figure 9B:
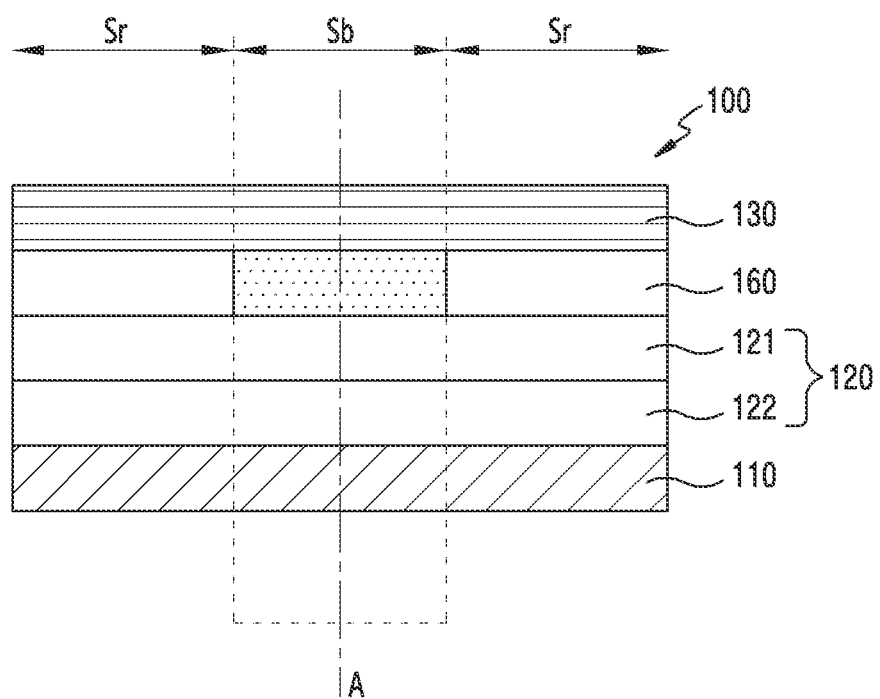

FIG. 9A and FIG. 9B are cross sections of a display according to various embodiments.

Referring to FIG. 9A and FIG. 9B, the display 100 can include a display panel 110, a window 120, an anti-reflection layer 130, and an anti-glare layer 160. The window 120 can have ductility to be pliable. According to various embodiments, the window 120 can be formed by a plurality of layers. The window 120 can include a first window 121 and a second window 122 of mutually different materials. The second window 122 can be disposed on the display panel 110, and the first window 121 can be disposed on the second window 122.

According to various embodiments, the first window 121 can include polyimide (PI). The second window 122 can include polyethylene terephthalate (PET). The first window 121 and the second window 122 can be formed transparent.

According to various embodiments, the anti-glare layer 160 can be disposed between the window 120 and the anti-reflection layer 130. The anti-glare layer 160 can be formed to surround the entire of the window 120, and the anti-glare layer 160 can be formed to surround a portion of the window 120.

Referring to FIG. 9B, the display 100 can include a flexible region (Sb) and the remnant region (Sr). When taking the anti-glare layer 160 upwardly, the flexible region (Sb) can be folded up or down with a criterion of a folding axis (A).

According to various embodiments, because the first window 121 is disposed more outside than the second window 122, in an in-foldable display, the first window 121 can suffer greater compressive stress than the second window 122, and compressive strain can be large. In an out-foldable display, the first window 121 can suffer greater tensile stress than the second window 122, and tensile strain can be large. The first window 121 can have a higher elongation than the second window 122, and can have lower Young's modulus.

According to various embodiments, the anti-glare layer 160 can be laminated only in a partial region of the window 120, or be formed and laminated to have an anti-glare function only in a partial region. The partial region can be the flexible region (Sb) including the folding axis (A).

According to various embodiments, the anti-reflection layer 130 can be disposed on the window 120, and the anti-glare layer 160 can be disposed between the window 120 and the display panel 110. The anti-reflection layer 130 can be disposed to surround the entire of the window 120.

According to various embodiments, the anti-glare layer 160 can be disposed wherein a region including a minute particle or a ruggedness surface is overlapped with the flexible region (Sb), and the anti-glare layer 160 can be disposed to include the minute particle or ruggedness surface only in the flexible region (Sb), and may not include the minute particle or ruggedness surface in the remnant region (Sr). The remnant region (Sr) of the anti-glare layer 160 can be formed integrally with the window 120, or be formed by an adhesive layer, etc.

According to various embodiments, when a step is formed with a criterion of a folding line (A) included in the flexible region (Sb), the anti-glare layer 160 can scatter light to decrease an amount of reflected light and thus, prevent a step portion from being acknowledged externally.

According to various embodiments, the anti-glare layer 160 can be disposed between the window 120 and the anti-reflection layer 130. The anti-glare layer 160 can be disposed on the first window 121. Light incident from the external can be partly reflected from and partly pass through the anti-reflection layer 130. The light reflected from the anti-reflection layer 130 and light reflected from an interface between the anti-reflection layer 130 and the anti-glare layer 160 can be destructively interfered. The light passing through the anti-reflection layer 130 and traveling to the anti-glare layer 160 can be scattered within the anti-glare layer 160.

According to various embodiments, the anti-glare layer 160 is disposed beneath the anti-reflection layer 130 and thus, the step portion formed in the window 120 and the display panel 110 may not be acknowledged externally.

According to various embodiments, the anti-reflection layer 130 may reduce reflectance by reflecting light reflected from the surface of the antireflection layer and light reflected from the lower interface of the antireflection layer, thereby causing destructive interference. Only partial light passing through the anti-reflection layer 130 can be scattered in the anti-glare layer 160, so the anti-reflection layer 130 can be positioned on the outskirts of the display 100.

According to various embodiments, the anti-glare layer 160 can scatter partial light passing through the anti-reflection layer 130, to prevent the acknowledgment of a step portion formed in a bent portion. The anti-glare layer 160 can be disposed on a layer in which strain is formed distinctly, to prevent the strain of the layer forming the display 100 from being acknowledged externally.

According to various embodiments, as described above, the anti-glare layer 160 can be disposed on at least one layer among the first window 121, the second window 122, the polarization layer 170, the optical clear adhesive layer 175 or the display panel 110. The anti-glare layer 160 can be disposed for all the respective layers constructing the display 100.

FIG. 10A, FIG. 10B, FIG. 10C, FIG. 10D, FIG. 10E, FIG. 10F, and FIG. 10G are schematic diagrams and cross sections of a display according to various embodiments.

Figure 10A:
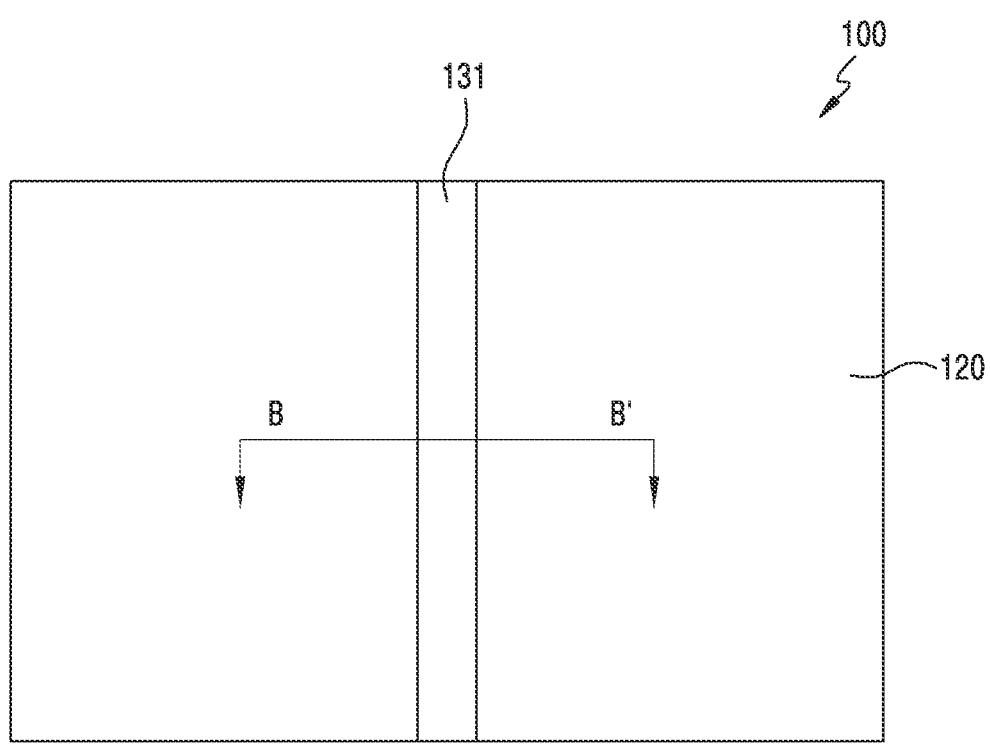
FIG. 10A, FIG. 10B, FIG. 10C, FIG. 10D, FIG. 10E, FIG. 10F, and FIG. 10G are schematic diagrams and cross sections of a display according to various embodiments.
Figure 10B:
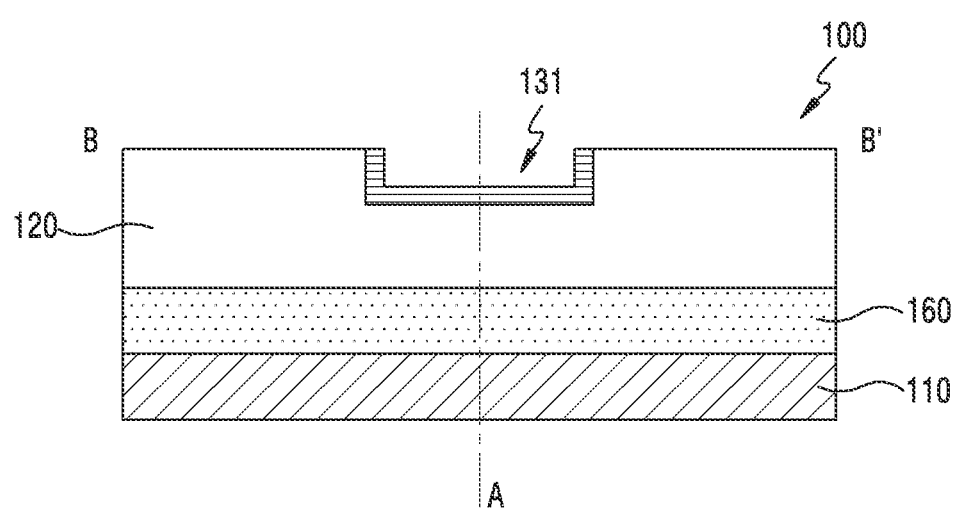
Figure 10C:
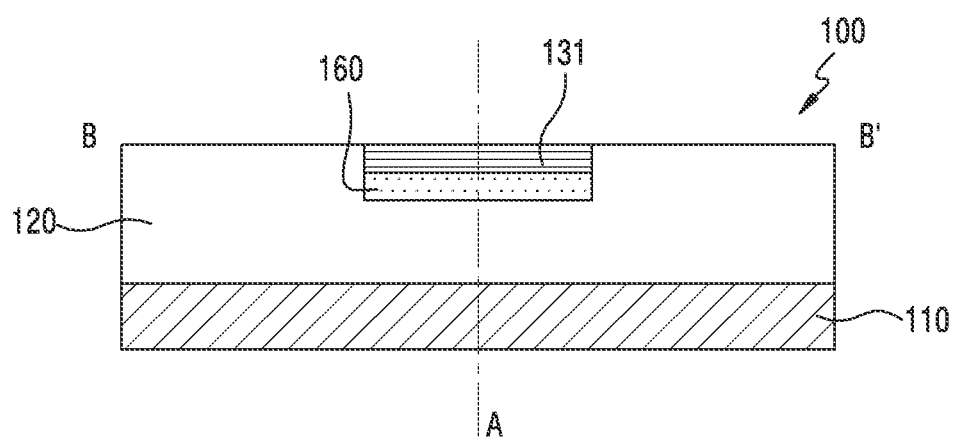

Referring to FIG. 10A, FIG. 10B, and FIG. 10C, the display 100 can include a window 120 and an anti-reflection layer 131. The anti-reflection layer 131 can be located in a flexible region of the window 120.

FIG. 10B and FIG. 10C represent diagrams the display 100 of FIG. 10A taken along line B-B'. The window 120 can be formed thinner in a folding region than another region. The anti-reflection layer 131 can be formed in a groove of the window 120 formed to be bent. An anti-glare layer 160 can be included between the window 120 and a display panel 110 disposed below the window 120. According to various embodiments, the anti-glare layer 160 can be disposed in a bending region of the window 120, and the anti-reflection layer 131 can be laminated on the anti-glare layer 160.

According to various embodiments, the groove of the window 120 positioned in the folding region can be filled up with the anti-reflection layer 131, and the anti-glare layer 160 can be formed in a portion of the groove, and the anti-reflection layer 131 can fill up a portion of the remnant of the groove.

Figure 10D:
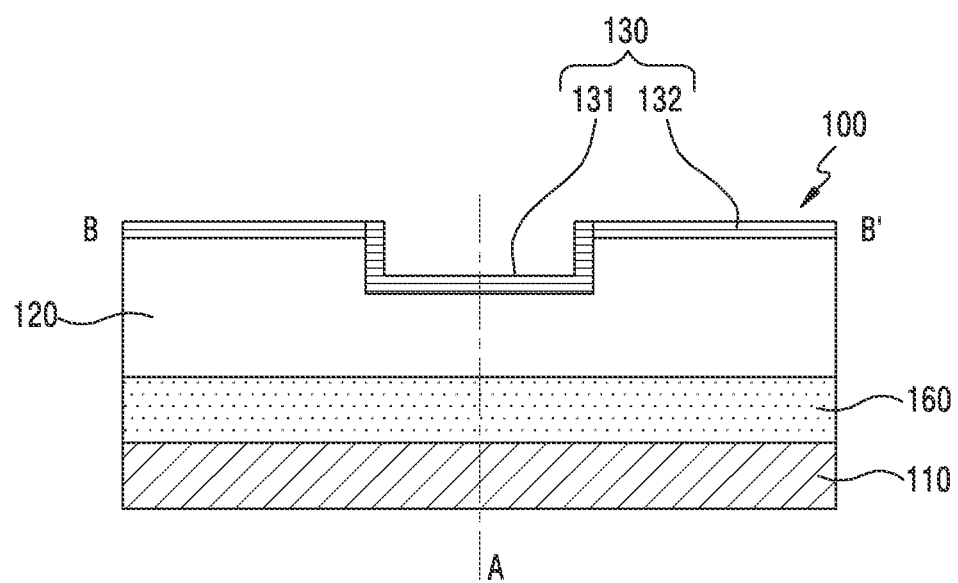
Figure 10E:
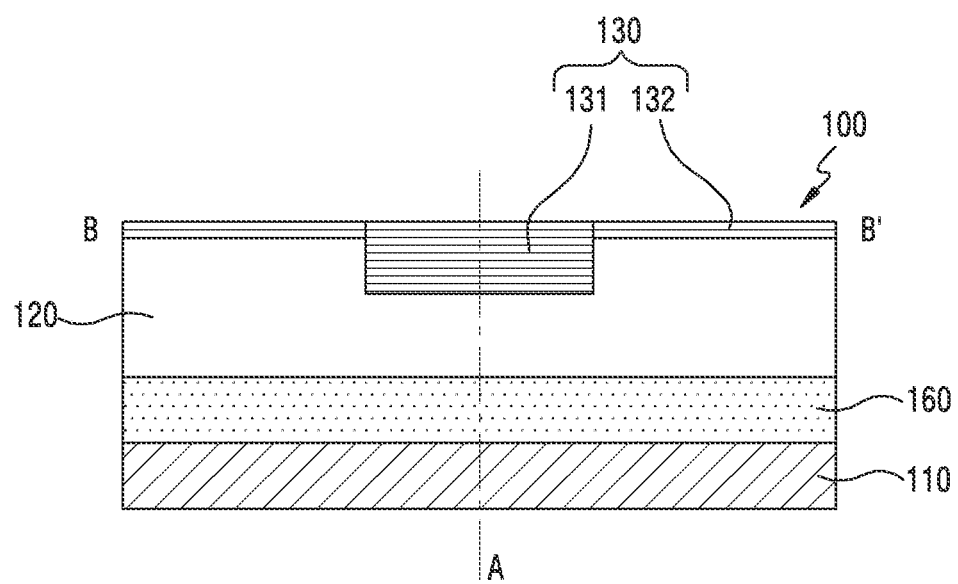

Referring to FIG. 10D and FIG. 10E, an anti-reflection layer 130 can be formed at a specific thickness along a bent surface of the window 120. The anti-reflection layer 130 can include a first anti-reflection layer 131 formed in a groove of the window 120 located in a bending region, and a second anti-reflection layer 132 formed in the remnant region. The first anti-reflection layer 131 and the second anti-reflection layer 132 can be formed integrally. The first anti-reflection layer 131 can fill up the groove of the window 120 located in the folding region.

Figure 10F:
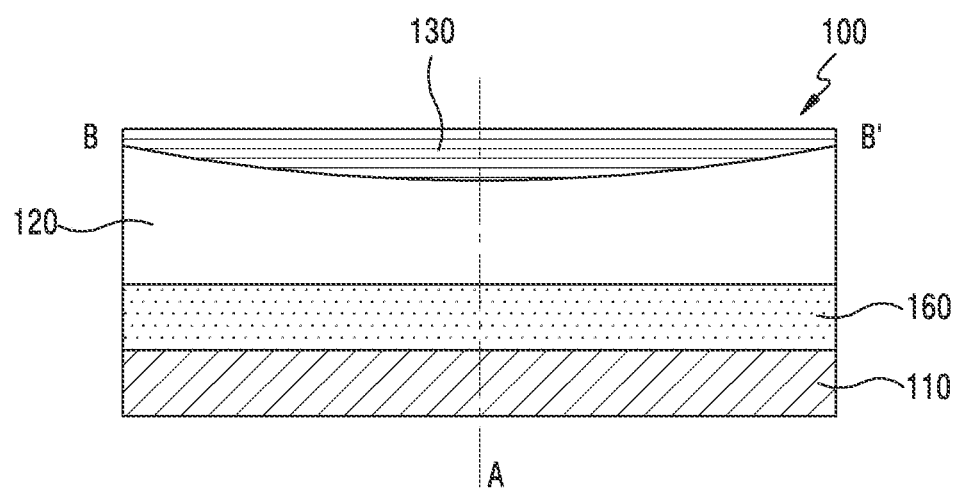
Figure 10G:
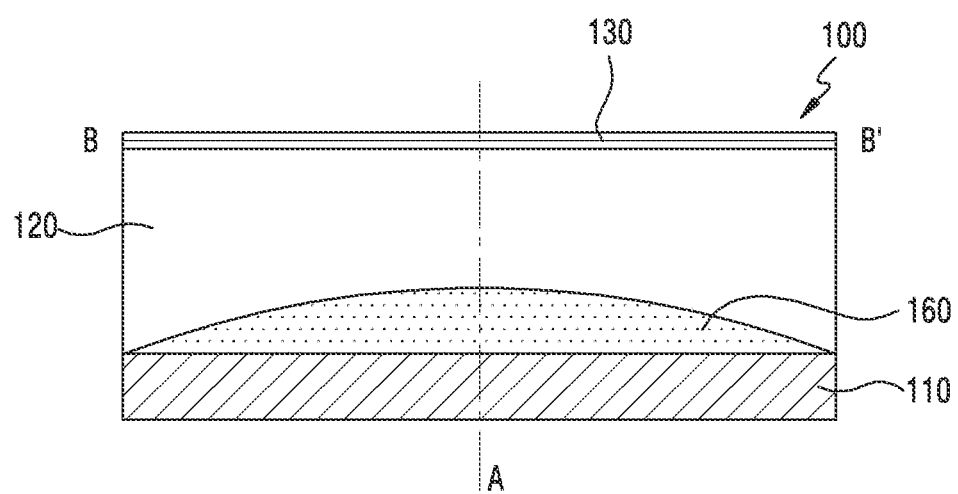

Referring to FIG. 10F and FIG. 10G, a window 120 can be formed thin at a folding axis (A), and can be formed thicker as it goes to a flat region. In the flat region, the window 120 can be formed at a specific thickness. An upper surface of the window 120 can be formed as a curved surface in a foldable region, and a lower surface can be formed as a curved surface in the foldable region.

According to various embodiments, in the foldable region, the upper surface and lower surface of the window 120 all can be formed as the curved surfaces and thus, the window 120 can get thinner as it goes to the folding axis.

Figure 11:
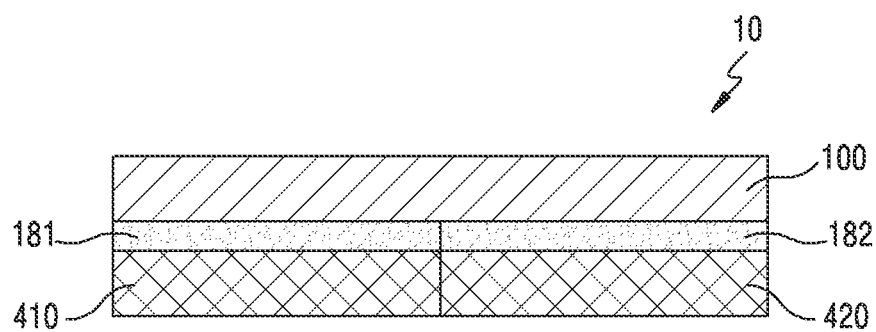
FIG. 11 is a cross section of an electronic device according to an embodiment.

FIG. 11 is a cross section of an electronic device according to an embodiment.

Referring to FIG. 11, the electronic device 10 can include a display 100, brackets 410 and 420 (e.g., a first bracket 410 and a second bracket 420 of FIG. 3C), and plates 181 and 182.

According to various embodiments, the display 100 can be a flexible display. The display 100 can be formed by a panel including polyimide (PI). The plates 181 and 182 can be disposed between the display 100 and the brackets 410 and 420.

According to various embodiments, the plate can be formed by the first plate 181 and the second plate 182, and one surface of the first plate 181 can come in touch with the first bracket 410, and the other surface of the first plate 181 can come in touch with one region of the display 100. One surface of the second plate 182 can come in touch with the second bracket 420, and the other surface of the second plate 182 can come in touch with the remnant region of the display 100.

According to various embodiments, because the flexible display has ductility, the first plate 181 and the second plate 182 can be attached to a rear surface of the display 100 and support the display 100, wherein they can keep the form of the display 100.

According to various embodiments, in response to the display 100 being folded, the first plate 181 and second plate 182 supporting the display 100 can be detached from each other, and can be coupled with the first bracket 410 and the second bracket 420 respectively and moved.

Figure 12A:
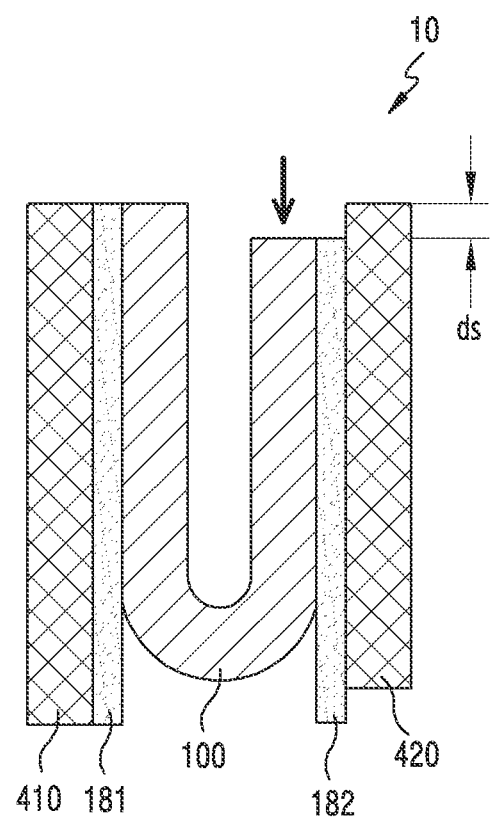
FIG. 12A and FIG. 12B are cross sections illustrating a folded state of the electronic device of FIG. 11 according to an embodiment.
Figure 12B:
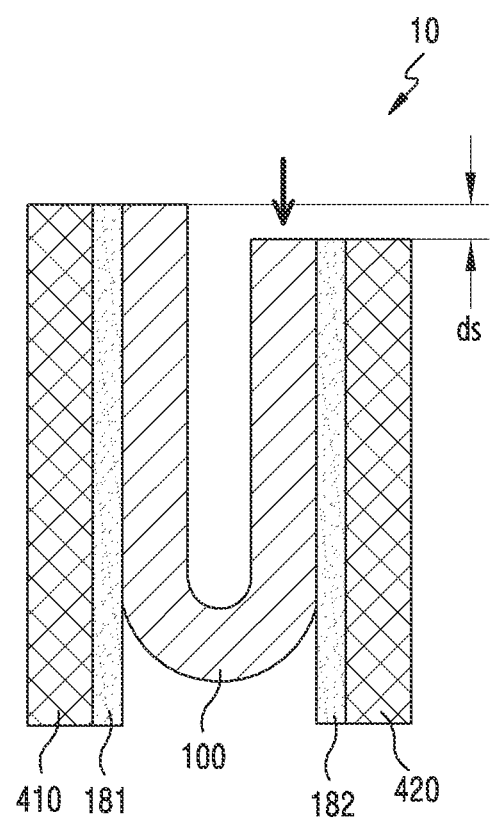

FIG. 12A and FIG. 12B are cross sections illustrating a folded state of the electronic device of FIG. 11 according to an embodiment.

Referring to FIG. 12A, in response to the display 100 being bent, a first plate 181 and a second plate 182 supporting the display 100 can be spaced apart, and can be coupled with a first bracket 410 and a second bracket 420 respectively and deformed.

According to an embodiment, the display 100 can be in a state of being adhered in a partial region of the first plate 181 and not being adhered in the remnant region of the first plate 181. The display 100 can be in a state of being adhered in a partial region of the second plate 182 and not being adhered in the remnant region of the second plate 182.

According to an embodiment, the second plate 182 can be slid or slipped from the second bracket 420 and be moved down by a specific distance (ds). In response to the display 100 being bent, a bent portion suffers compressive stress at its inner side, and suffers tensile stress at its outer side and thus, interlayer deformation of the display 100 can take place, and a deformed portion can be acknowledged externally.

According to various embodiments, in response to the second plate 182 being slid or slipped, it can decrease stress applied to a bending region of the display 100, and reduce the interlayer deformation of the display 100.

According to various embodiments, the second bracket 420 can include a guide groove to guide the sliding of the second plate 182, and the second plate 182 can include a protrusion portion corresponding to the guide groove of the second bracket 420. According to various embodiments, the second plate 182 can include a guide groove to slide along the second bracket 420, and the second bracket 420 can include a protrusion portion corresponding to the guide groove of the second plate 182.

Referring to FIG. 12B, in response to the display 100 being bent, a first plate 181 and a second plate 182 supporting the display 100 can be spaced apart, and can be coupled with a first bracket 410 and a second bracket 420 respectively and deformed.

According to various embodiments, the second plate 182 can be coupled with the second bracket 420. A portion of the second plate 182 can be coupled with the display 100, and the remnant portion of the second plate 182 can be spaced apart from the display 100 wherein the bending of the display 100 is made easy.

According to an embodiment, the second plate 182 and the second bracket 420 can be slid or slipped together with the display 100 and be moved by a specific distance (ds) with a criterion of the first plate 181 and the second bracket 420. In response to the display 100 being bent, a bent portion suffers compressive stress at its inner side, and suffers tensile stress at its outer side and thus, interlayer deformation of the display 100 can take place, and a deformed portion can be acknowledged externally.

According to various embodiments, in response to the second plate 182 and the second bracket 420 being slid or slipped, it can decrease stress applied to a bending region of the display 100, and reduce interlayer deformation of the display 100.

According to various embodiments, the second plate 182 and the second bracket 420 can be slid within a housing structure (e.g., the second housing structure 520 of FIG. 3C), and the housing structure 520 can include a guide groove wherein the second plate 182 and the second bracket 420 are slidable. The guide groove can be formed in the second plate 182 or the second bracket 420 wherein sliding can be made within the housing structure 520.

According to various embodiments, a slip layer can be included wherein slip is possible between the second bracket 420 and the housing structure 520. The slip layer can be formed of deformable materials, and can be formed of materials having an excellent restoring force. The slip layer can include a rubber having an excellent restoring force, a foam resin, a spring having a high modulus of elasticity, a pressure sensitive adhesive (PSA), etc.

Figure 13A:
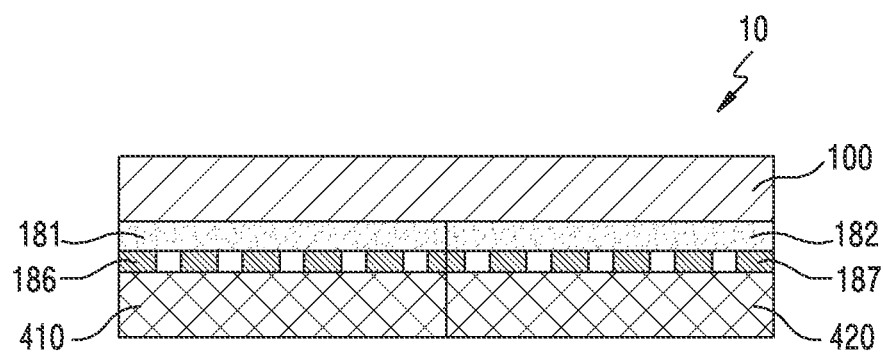
FIG. 13A is a cross section of an electronic device according to various embodiments.
Figure 13B:
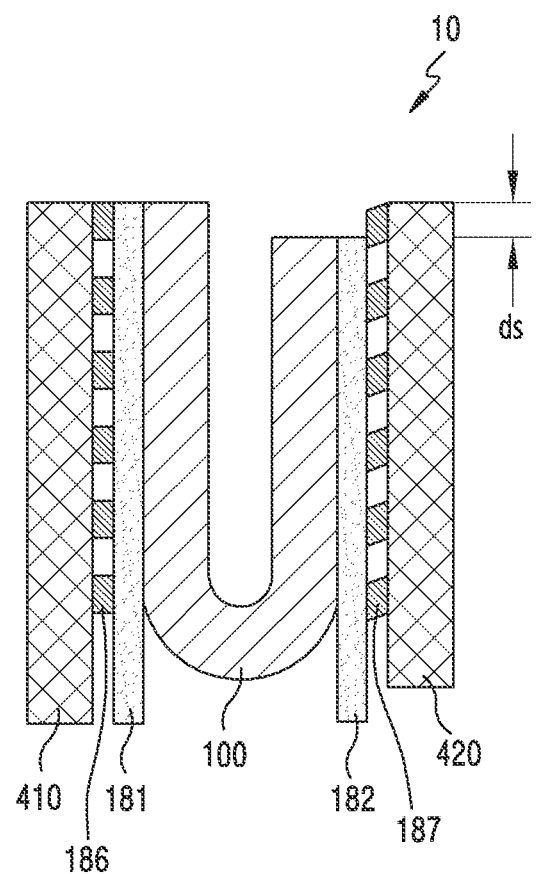
FIG. 13B is a cross section illustrating a folded state of the electronic device according to various embodiments.

FIG. 13A is a cross section of an electronic device according to various embodiments, and FIG. 13B is a cross section illustrating a folded state of the electronic device according to various embodiments.

Referring to FIG. 13A, the electronic device 10 can include a display 100, brackets 410 and 420 (e.g., the first bracket 410 and the second bracket 420 of FIG. 3C), plates 181 and 182, and slip layers 186 and 187.

According to various embodiments, the display 100 can be a flexible display. The plates 181 and 182 can be disposed between the display 100 and the brackets 410 and 420. The slip layers 186 and 187 can be disposed between the plates 181 and 182 and the brackets 410 and 420, and the plates 181 and 182 can be separated from the brackets 410 and 420 and be floated.

According to various embodiments, the plate can be formed by the first plate 181 and the second plate 182, and one surface of the first plate 181 can come in touch with the first bracket 410, and the other surface of the first plate 181 can come in touch with one region of the first slip layer 186. One surface of the second plate 182 can come in touch with the second bracket 420, and the other surface of the second plate 182 can come in touch with the remnant region of the second slip layer 187.

According to various embodiments, because the flexible display has ductility, the first plate 181 and the second plate 182 can be attached to a rear surface of the display 100 and support the display 100, wherein they can keep the form of the display 100.

Referring to FIG. 13B, in response to the display 100 being bent, the first plate 181 and second plate 182 supporting the display 100 can be spaced apart. The first plate 181 and the second plate 182 can be coupled with the first slip layer 186 and the second slip layer 187, and can be slipped from the first bracket 410 and the second bracket 420.

According to various embodiments, the first slip layer 186 and the second slip layer 187 can include a void space inside wherein deformation is made easy. The first slip layer 186 and the second slip layer 187 can be formed of deformable materials, and can be formed of materials having an excellent restoring force. The slip layer can include a rubber having an excellent restoring force, a foam resin, a spring having a high modulus of elasticity, a pressure sensitive adhesive (PSA), etc.

Figure 14A:
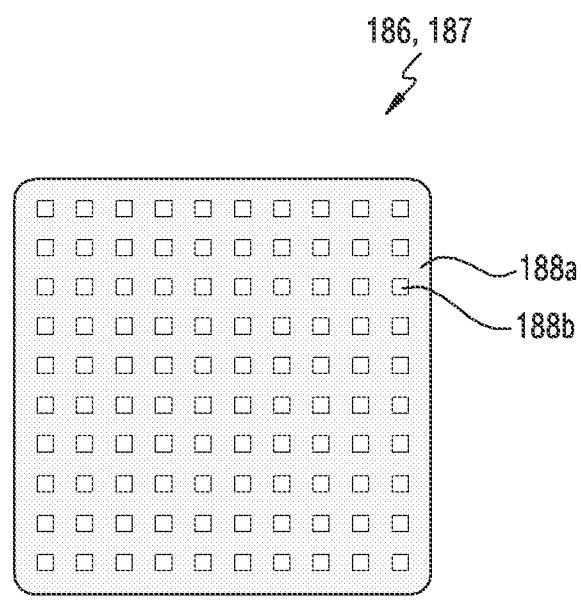
FIG. 14A, FIG. 14B, FIG. 14C, FIG. 14D, and FIG. 14E are cross sections illustrating various pattern layers of an electronic device according to various embodiments.
Figure 14B:
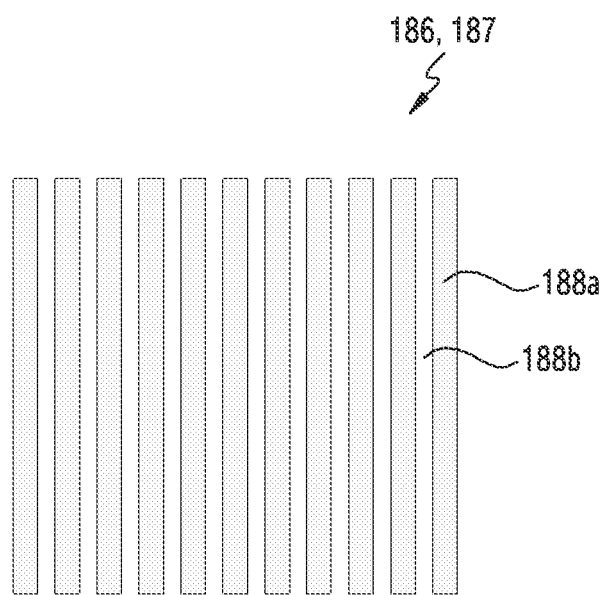
Figure 14C:
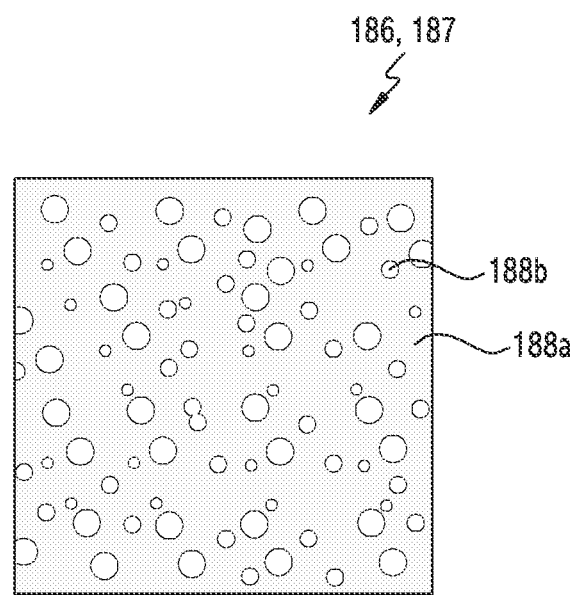

FIG. 14A, FIG. 14B, and FIG. 14C are cross sections illustrating various pattern layers of an electronic device according to various embodiments.

Referring to FIG. 14A, a first slip layer 186 and a second slip layer 187 can include a pattern having various spaces. Referring to FIG. 14A, the first slip layer 186 and the second slip layer 187 can include an opening 188b formed in a region 188a constructing the slip layers. The opening 188b has been formed in a rectangular shape, but can be formed in various forms such as a circle shape, an oval shape, etc. In response to being formed in the oval shape, a long axis of the oval can be disposed in a direction vertical to a direction in which the plate (the first plate 181 and the second plate 182 of FIG. 13A) is slid. In response to being formed in the rectangular shape, a long side of the rectangular shape can be disposed in a direction vertical to a direction in which the plate is slid.

Referring to FIG. 14B, in a first slip layer 186 and a second slip layer 187, slippable materials 188a of a long rectangular shape can be iteratively disposed putting a void space 188b of a specific width. In the slippable materials 188a of the long rectangular shape, a long side of the rectangular shape can be disposed in a direction vertical to a direction in which a plate is slid. According to various embodiments, in the slippable materials formed in the long rectangular shape, the long side of the rectangular shape can be iteratively disposed in an oblique (diagonal) direction in the first slip layer 186 and the second slip layer 187. In response to the plate being slid, the first slip layer 186 and the second slip layer 187 can be deformed into a void space and thus slip can take place easily. As illustrated in FIG. 14B, a shape of the slip layer can be formed to be the rectangular shape, and can be a zigzag shape bent in a multi-stage. According to various embodiments, the slip layer can be formed in various patterns in which the slippable materials 188a can be disposed putting the void space 188b.

Referring to FIG. 14C, a first slip layer 186 and a second slip layer 187 are formed of slippable materials 188a, and can include an irregular opening 188b (e.g., the void space 188b of FIG. 14A) inside.

According to various embodiments, a display (the display 100 of FIG. 13A) can select a pattern differently according to a required degree of slip, and the first slip layer 186 and the second slip layer 187 can be formed in the same pattern.

According to various embodiments, the first slip layer 186 and the second slip layer 187 can be formed in a mutually different pattern. For example, in response to the first plate 181 less needing slip, the first slip layer 186 can be formed by a layer not having a pattern, and in response to the second plate 182 much needing slip, the second slip layer 187 can be formed by a layer including a pattern easily deformable. According to various embodiments, intervals of the patterns formed by the slippable materials 188a and the void space 188b can be different from each other, and intervals of at least some patterns can be the same as each other.

Figure 14D:
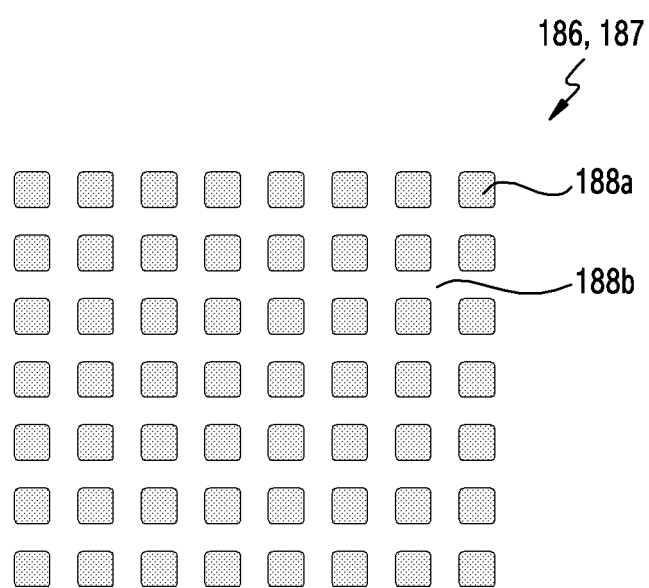

Referring to FIG. 14D, slippable materials 188a forming patterns, and void spaces 188b forming intervals between the patterns can be formed. The slippable materials 188a can be formed in a pattern of a square shape. Unlike the shape of the shown pattern, the slippable materials 188a can be formed in a circle shape or a rectangular shape, and can differently form a width or length of each pattern. According to various embodiments, intervals of the patterns formed by the slippable materials 188a and the void space 188b can be different from each other, and intervals of at least some patterns can be the same as each other.

Figure 14E:
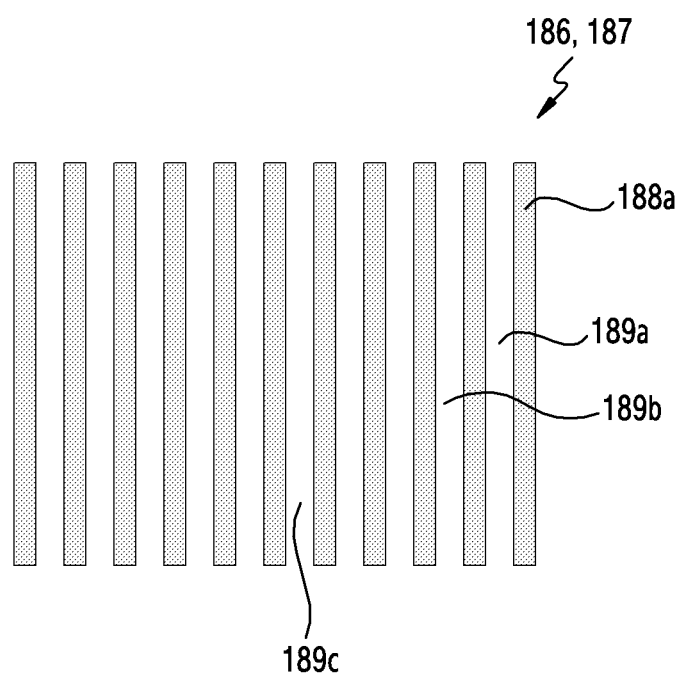

Referring to FIG. 14E, in a first slip layer 186 and a second slip layer 187, slippable materials 188a of a long rectangular shape can be iteratively disposed interposing void spaces 189a, 189b, and 189c therebetween. In the slippable materials 188a of the long rectangular shape, a long side of the rectangular shape can be disposed in a direction vertical to a direction in which a plate is slid. According to various embodiments, in the slippable materials of the long rectangular shape, a long side of the rectangular shape can be iteratively disposed in an oblique (diagonal) direction in the first slip layer 186 and the second slip layer 187. In response to the plate being slid, the first slip layer 186 and the second slip layer 187 can be deformed into a void space and thus slip can take place easily.

According to various embodiments, widths of the void space 189a positioned in a periphery and the adjacent void space 189b can be different from each other. The void space 189c positioned at the center can be wider or narrower in width than the other void spaces 189a and 189b. The void spaces 189a and 189b formed between the slippable materials 188a can be disposed at a width mutually symmetric with a criterion of the void space 189c located at the center. The void spaces 189a and 189b formed between the slippable materials 188a can be formed more widely in a region where stress applied by strain is large when the display 100 is folded.

Figure 15A:
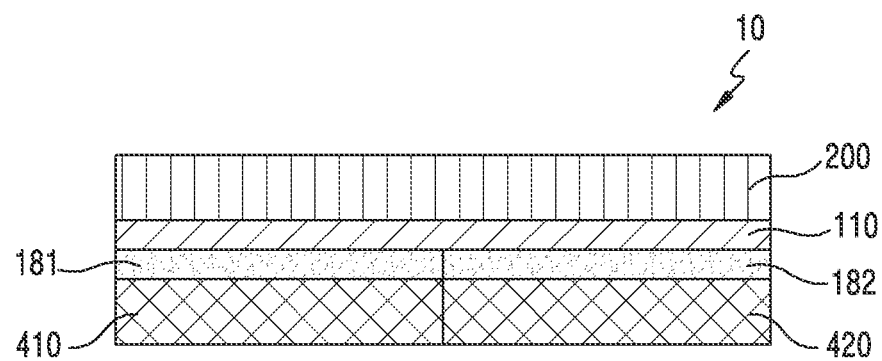
FIG. 15A is a cross section of an electronic device according to various embodiments.
Figure 15B:
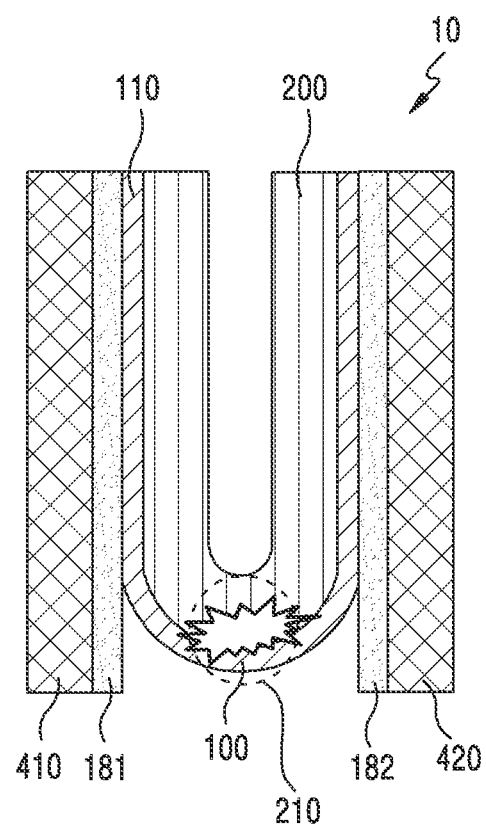
FIG. 15B is a cross section illustrating a folded state of the electronic device according to various embodiments.

FIG. 15A is a cross section of an electronic device according to various embodiments, and FIG. 15B is a diagram illustrating a folded state of the electronic device according to various embodiments.

Referring to FIG. 15A, the electronic device 10 can include a display panel 110, a protection layer 200, brackets 410 and 420 (e.g., the first bracket 410 and the second bracket 420 of FIG. 3C), and plates 181 and 182.

According to various embodiments, the display panel 110 can be formed by a panel including polyimide (PI), and can be a flexible display panel. The plates 181 and 182 can be disposed between the display panel 110 and the brackets 410 and 420.

According to various embodiments, the protection layer 200 can be disposed on the display panel 110, and can be formed by a plurality of layers. The protection layer 200 can include a polarization layer, a window, an anti-reflection layer, an anti-glare layer, or an anti-fingerprint layer. Similarly with the display panel 110, the respective layers forming the protection layer 200 can include materials having ductility.

According to various embodiments, the plate can be formed by the first plate 181 and the second plate 182, and one surface of the first plate 181 can come in touch with the first bracket 410, and the other surface of the first plate 181 can come in touch with one region of the display panel 110. One surface of the second plate 182 can come in touch with the second bracket 420, and the other surface of the second plate 182 can come in touch with the remnant region of the display panel 110.

According to various embodiments, because the flexible display has ductility, the first plate 181 and the second plate 182 can be attached to a rear surface of the display panel 110 and support the display panel 110 and the protection layer 200, wherein they can keep the form of the display panel 110 and the protection layer 200.

According to various embodiments, in a state in which the display panel 110 and the protection layer 200 are folded, the first plate 181 and the second plate 182 can be detached from each other, and can be coupled with the first bracket 410 and the second bracket 420 respectively and moved.

Referring to FIG. 15B, in response to the display 100 being bent, the first plate 181 and the second plate 182 supporting the display 100 can be spaced apart, and can be coupled with the first bracket 410 and the second bracket 420 respectively and deformed.

According to an embodiment, the display 100 can be in a state of being adhered in a partial region of the first plate 181 and not being adhered in the remnant region of the first plate 181. The display 100 can be in a state of being adhered in a partial region of the second plate 182 and not being adhered in the remnant region of the second plate 182.

The display 100 can include the display panel 110 and the protection layer 200. The protection layer 200 can be formed by a plurality of layers, and in response to the display 100 being bent, stress is concentrated in a bending region 210 and thus the respective layers of the protection layer 200 can be deformed. Also, strain can occur even in an interface between the display panel 110 and the protection layer 200, and in response to using a flexible device continuously, damage can occur in the bending region 210.

Figure 16A:
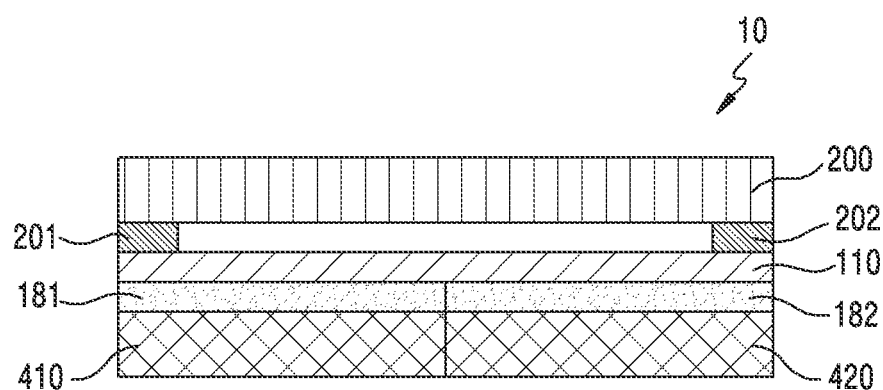
FIG. 16A is a cross section modifying the electronic device of FIG. 15A according to various embodiments.
Figure 16B:
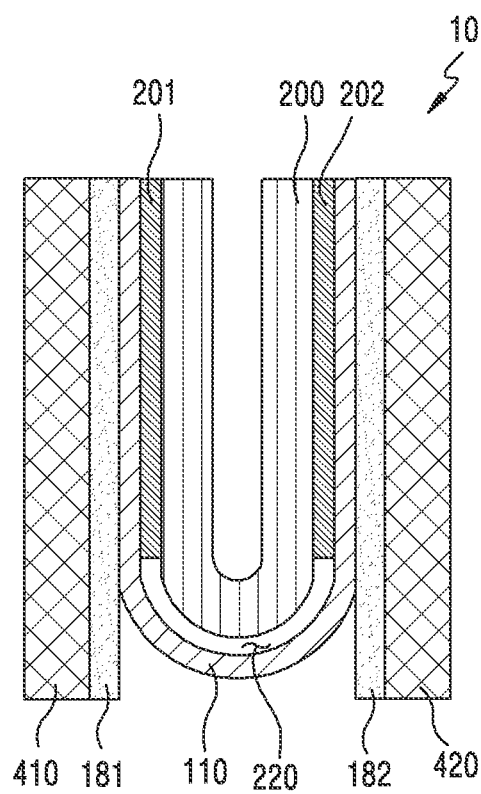
FIG. 16B is a diagram illustrating a folded state of the electronic device of FIG. 16A according to various embodiments.

FIG. 16A is a cross section modifying the electronic device of FIG. 15A according to various embodiments, and FIG. 16B is a diagram illustrating a folded state of the electronic device of FIG. 16A according to various embodiments.

Referring to FIG. 16A and FIG. 16B, adhesive layers 201 and 202 can be formed wherein a void space 220 can be formed between a display panel 110 and a protection layer 200. A first plate 181 can be disposed in a region corresponding to one region of the display panel 110, and a second plate 182 can be disposed in a region corresponding to the remnant region of the display panel 110. The first plate 181 and the second plate 182 can be coupled with the first bracket 410 and the second bracket 420, respectively.

According to various embodiments, stress in a bending region can increase according to thicknesses of the protection layer 200 and the display panel 110 that exist in the bending region. According to an embodiment, the protection layer 200 and the display panel 110 in the bending region are spaced apart from each other and thus, stress resulting from strain of the protection layer 200 and the display panel 110 may not be applied, so stress occurring in the entire bending region of the electronic device 10 can be decreased.

According to various embodiments, the internal space 220 can be formed by an air layer. To prevent a deterioration of light characteristic caused by a difference of refractive indexes between air, a protection layer, and adhesive layers, an anti-reflection layer can be additionally formed in a protection layer region corresponding to the internal space 220.

Figure 17A:
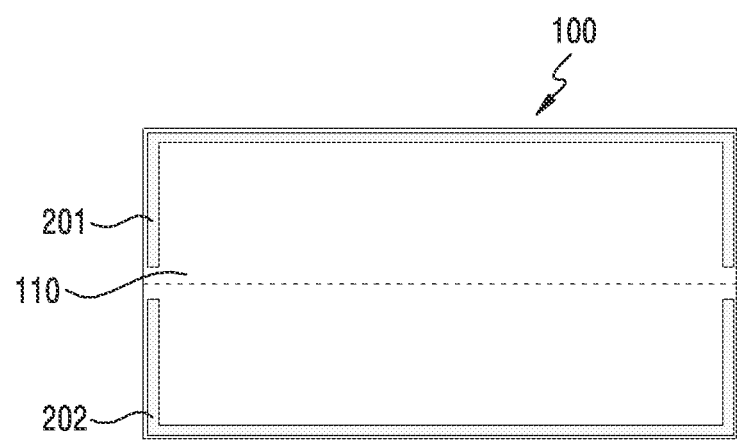
FIG. 17A and FIG. 17B are diagrams illustrating an attachment region of a protection layer of an electronic device according to various embodiments.
Figure 17B:
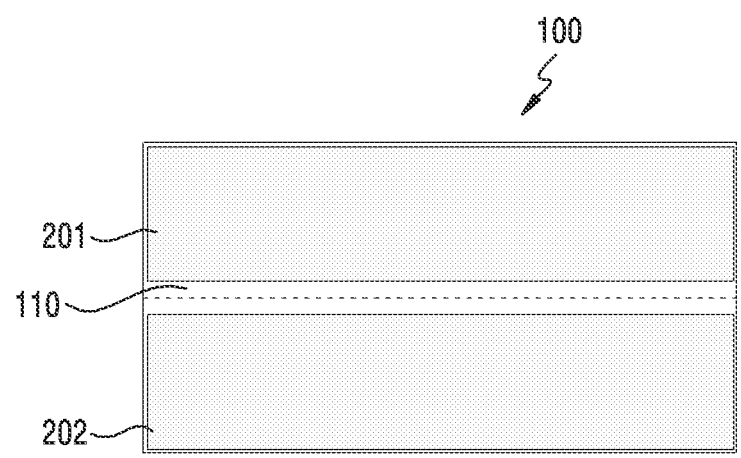

FIG. 17A and FIG. 17B are diagrams illustrating an attachment region of a protection layer of an electronic device according to various embodiments.

Referring to FIG. 17A and FIG. 17B, the display 100 can include a first adhesive layer 201 and a second adhesive layer 202 on a display panel 110. The first adhesive layer 201 and the second adhesive layer 202 can bond the display panel 110 and the protection layer. The first adhesive layer 201 and the second adhesive layer 202 can be optical clear adhesive layers.

According to various embodiments, to form a void space in a bending region of the display panel 110 by spacing the display panel 110 apart from the protection layer, the first adhesive layer 201 and the second adhesive layer 202 may not be formed around a folding axis.

According to an embodiment, the first adhesive layer 201 and the second adhesive layer 202 can be formed along a periphery of the display panel 110, and the first adhesive layer 201 and the second adhesive layer 202 can be disposed to be spaced apart centering on the folding axis.

According to various embodiments, the first adhesive layer 201 and the second adhesive layer 202 can be disposed to be spaced apart centering on the folding axis and thus, a void space can be formed around the folding axis. The first adhesive layer 201 and the second adhesive layer 202 can be formed in regions corresponding to regions of the rest of the display panel 110.

An electronic device of various embodiments, described above, can include a display panel (e.g., the display panel 110 of FIG. 4) of which at least a portion is flexible, a window (e.g., the window 120 of FIG. 4) disposed above at least the portion of the display panel, an anti-reflection layer (AR/LR) (e.g., the anti-reflection layer 130 of FIG. 4) disposed on at least a portion of the window, and an anti-glare layer (AG) (e.g., the anti-glare layer 160 of FIG. 4) disposed beneath at least the portion of the window.

According to an embodiment, the electronic device can further include a shock protection layer (PET) (e.g., the second window 122 of FIG. 5A) disposed beneath the window.

According to an embodiment, the display panel can include a foldable region, and flat regions at both sides of the foldable region.

According to an embodiment, the anti-glare layer can be overlapped at least with the foldable region.

According to an embodiment, the window can include a polyimide (PI) resin.

According to an embodiment, the electronic device can further include a polarization layer (e.g., the polarization layer 170 of FIG. 5C) disposed below the window.

According to an embodiment, the electronic device can further include an optical clear adhesive layer (OCA) (e.g., the optical clear adhesive layer 175 of FIG. 5C) disposed between the polarization layer and the window.

According to an embodiment, the electronic device can include a plate (e.g., the first plate 181 and the second plate 182 of FIG. 12A) of which one surface comes in touch with the respective flat regions disposed at the both sides of the foldable region, a bracket (e.g., the first bracket 410 and the second bracket 420 of FIG. 12A) looking at the other surface of the plate, and a slip layer (e.g., the slip layers 186 and 187 of FIG. 13A) disposed between the bracket and the plate.

According to an embodiment, the slip layer can include an iterative pattern which is formed by slippable materials (e.g., the slippable materials of FIG. 14A to FIG. 14E) and void spaces (e.g., the opening 188*b* of FIG. 14A or the void space 188*b* of FIG. 14B).

According to an embodiment, in the foldable region, a void space can be offered between the display panel and the window.

According to an embodiment, the electronic device can further include an adhesive layer disposed in at least a portion of the flat region and spacing the display panel and the window apart.

A display device of various embodiments can include a display panel (e.g., the display panel 110 of FIG. 9A) of which at least a portion is flexible, a window (e.g., the window 120 of FIG. 9A) disposed above at least the portion of the display panel, an anti-glare layer (AG) (e.g., the anti-glare layer 160 of FIG. 9A) disposed on at least the portion of the window, and an anti-reflection layer (AR/LR) (e.g., the anti-reflection layer 130 of FIG. 9A) disposed on the anti-glare layer.

According to an embodiment, the window can include a first window (e.g., the first window 121 of FIG. 9A) disposed beneath the anti-glare layer, and a second window (e.g., the second window 122 of FIG. 9B) disposed beneath the first window.

According to an embodiment, the first window and the second window can be formed of heterogeneous materials.

According to an embodiment, the first window can include a polyimide resin.

According to an embodiment, the display device can further include a polarization layer disposed below the window.

According to an embodiment, the display panel can include a foldable region, and flat regions at both sides of the foldable region.

According to an embodiment, the anti-glare layer can be overlapped at least with the foldable region.

According to an embodiment, the anti-reflection layer can destructively interfere at least a portion of light reflected from the anti-reflection layer.

According to an embodiment, the anti-reflection layer can include a plurality of layers, and the destructively interfered light can include a visible light range.

Methods of embodiments mentioned in claims or a specification of the present disclosure can be implemented in the form of hardware, software, or a combination of hardware and software.

In response to being implemented by software, a computer-readable storage media storing one or more programs (software modules) can be offered. The one or more programs stored in the computer-readable storage media are configured to be executable by one or more processors within an electronic device. The one or more programs include instructions for enabling the electronic device to execute methods of embodiments mentioned in the claims or specification of the present disclosure.

These programs (i.e., software modules and/or software) can be stored in a random access memory (RAM), a non-volatile memory including a flash memory, a read only memory (ROM), an electrically erasable programmable ROM (EEPROM), a magnetic disc storage device, a compact disc-ROM (CD-ROM), digital versatile discs (DVDs), an optical storage device of another form, and/or a magnetic cassette. Or, it can be stored in a memory that is configured in combination of some or all of them. Also, each configured memory can be included in plural as well.

Also, the program can be stored in an attachable storage device that can access via a communication network such as the Internet, an intranet, a local area network (LAN), a wireless LAN (WLAN) or a storage area network (SAN), or a communication network configured in combination of them. This storage device can access a device performing an embodiment of the present disclosure via an external port. Also, a separate storage device on the communication network can access the device performing the embodiment of the present disclosure as well.

In the above-described concrete embodiments of the present disclosure, components included in the disclosure have been expressed in the singular form or plural form according to a proposed concrete embodiment. But, the expression of the singular form or plural form is selected suitable to a given situation for description convenience's sake, and the present disclosure is not limited to singular or plural components. Even if it is a component expressed in the plural form, it can be constructed in the singular form, or even if it is a component expressed in the singular form, it can be constructed in the plural form.

On the other hand, in a detailed description of the present disclosure, a concrete embodiment has been described, but it is undoubted that various modifications are available without departing from the scope of the present disclosure. Therefore, the scope of the present disclosure should not be limited to and defined by the described embodiment and should be defined by not only claims stated later but also equivalents to these claims.

The invention claimed is:

1. An electronic device comprising:
 a display panel of which at least a portion is flexible, the display panel including a foldable region and flat regions at both sides of the foldable region;
 a window disposed above at least the portion of the display panel, the window including a groove arranged in a region corresponding to the foldable region, wherein a thickness of the region corresponding to the foldable region is thinner than a thickness of other regions corresponding to the flat regions;
 an anti-reflection layer (AR/LR) entirely disposed inside the groove, above at least a portion of the window;
 an anti-glare layer (AG) disposed below at least the portion of the window;
 a polarization layer disposed below the window; and
 an optical clear adhesive layer (OCA) disposed between the polarization layer and the anti-glare layer.

2. The electronic device of claim 1, further comprising:
 a shock protection layer formed of polyethylene terephthalate (PET) disposed below the window.

3. The electronic device of claim 1, wherein the anti-glare layer is overlapped at least with the foldable region.

4. The electronic device of claim 1, wherein the window comprises a polyimide (PI) resin.

5. The electronic device of claim 1, further comprising:
 a plate of which one surface comes in touch with the respective flat regions disposed at the both sides of the foldable region;
 a bracket facing another surface of the plate; and
 a slip layer disposed between the bracket and the plate.

6. The electronic device of claim 5, wherein the slip layer comprises an iterative pattern which is formed by slippable materials and void spaces.

7. The electronic device of claim 5, wherein, in the foldable region, a void space is offered between the display panel and the window.

8. The electronic device of claim 7, further comprising:
 an adhesive layer disposed in at least a portion of the flat region and spacing the display panel and the window apart.

9. The electronic device of claim 1, wherein the window comprises a first window disposed below the anti-reflection layer, and a second window disposed below the first window.

10. The electronic device of claim 9, wherein the first window and the second window are formed of heterogeneous materials.

11. The electronic device of claim 1, wherein the anti-reflection layer destructively interferes at least a portion of light reflected from the anti-reflection layer.

12. The electronic device of claim 1, wherein the window is at least partially exposed to the exterior of the electronic device.

* * * * *